(12) United States Patent
Sorden et al.

(10) Patent No.: US 10,198,141 B2
(45) Date of Patent: Feb. 5, 2019

(54) LOCATION-BASED SERVICES

(71) Applicants: Gary Sorden, Celina, TX (US);
Michael Hinsley, Midland, TX (US)

(72) Inventors: Gary Sorden, Celina, TX (US);
Michael Hinsley, Midland, TX (US)

( * ) Notice: Subject to any disclaimer, the term of this patent is extended or adjusted under 35 U.S.C. 154(b) by 0 days.

(21) Appl. No.: 15/632,560

(22) Filed: Jun. 26, 2017

(65) Prior Publication Data

US 2017/0293848 A1 Oct. 12, 2017

Related U.S. Application Data

(63) Continuation of application No. 13/688,011, filed on Nov. 28, 2012, now Pat. No. 9,720,555.

(60) Provisional application No. 61/579,735, filed on Dec. 23, 2011, provisional application No. 61/684,415, filed on Aug. 17, 2012.

(51) Int. Cl.

| | |
|---|---|
| *G06F 3/00* | (2006.01) |
| *G06F 3/048* | (2013.01) |
| *H04W 4/02* | (2018.01) |
| *E21B 41/00* | (2006.01) |
| *G06F 3/0481* | (2013.01) |
| *G06F 17/50* | (2006.01) |
| *G06N 5/04* | (2006.01) |
| *G06T 11/20* | (2006.01) |
| *G06T 11/60* | (2006.01) |
| *G06T 17/05* | (2011.01) |
| *H04L 29/08* | (2006.01) |
| *H04W 4/021* | (2018.01) |
| *H04W 4/80* | (2018.01) |
| *G06F 3/0482* | (2013.01) |

(52) U.S. Cl.
CPC .......... *G06F 3/048* (2013.01); *E21B 41/0092* (2013.01); *G06F 3/04817* (2013.01); *G06F 17/5009* (2013.01); *G06N 5/04* (2013.01); *G06T 11/206* (2013.01); *G06T 11/60* (2013.01); *G06T 17/05* (2013.01); *H04L 67/10* (2013.01); *H04W 4/02* (2013.01); *H04W 4/021* (2013.01); *G06F 3/0482* (2013.01); *H04W 4/80* (2018.02)

(58) Field of Classification Search
CPC ............ B22F 2005/001; B22F 2999/00; B22F 2998/00; B22F 7/06; B22F 2998/10; B22F 3/15; B22F 7/08; B22F 1/0025; B22F 7/04; B22F 1/0014; B22F 3/02; B22F 3/1003; B22F 3/26; B22F 1/02; B22F 2201/20; B22F 3/1017; B22F 7/02
See application file for complete search history.

(56) References Cited

U.S. PATENT DOCUMENTS

| | | | |
|---|---|---|---|
| 7,970,545 B2* | 6/2011 | Sanstrom | G01V 1/34 367/73 |
| 8,175,751 B2* | 5/2012 | Thakur | E21B 43/16 700/266 |
| 2010/0114493 A1* | 5/2010 | Vestal | E21B 41/00 702/9 |

* cited by examiner

*Primary Examiner* — Di Xiao

(57) ABSTRACT

A system and method for managing location-based information associated with the oil and gas industry. The system, in one embodiment, comprises a computing device connected to a location-based service, wherein the location-based information comprises energy operations data which is associated with a specific geographic location, and wherein the computing device is associated with a graphical map interface. The graphical map interface is configured to display location based information. The graphical map interface can also be configured to display an indication of the (Continued)

frequency of an event. The location based information can be associated with a geofence.

20 Claims, 19 Drawing Sheets

LOCATION-BASED SERVICES

CROSS REFERENCE TO RELATED APPLICATION

This application is a continuation of U.S. application Ser. No. 13/688,011 filed Nov. 28, 2012 entitled "Location-based Services," which claims the benefit of provisional U.S. Application No. 61/579,735 entitled "Location-based Services" filed Dec. 23, 2011, and provisional U.S. Application No. 61/684,415 entitled "Location-based Services" filed Aug. 17, 2012, all of which applications are incorporated herein in their entireties.

BACKGROUND OF THE INVENTION

Computing devices have become more feature-oriented and able to provide more flexibly than even some desktop computers. Most computing devices in use today can have features including personal digital assistants, messaging services, video capabilities, cameras, Internet connectivity, voice automated responses, and connectivity to Wi-Fi services, etc. Unlike desktop computers, mobile devices can provide features to users based upon the location of the wireless device.

BRIEF DESCRIPTION OF THE DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION OF THE INVENTION

Several embodiments of Applicants' invention will now be described with reference to the drawings. Unless otherwise noted, like elements will be identified by identical numbers throughout all figures. The invention illustratively disclosed herein suitably may be practiced in the absence of any element which is not specifically disclosed herein.

Embodiments of the inventions disclosed in FIGS. 1-29 may use some or all of the components shown in each figure.

Figure 1:
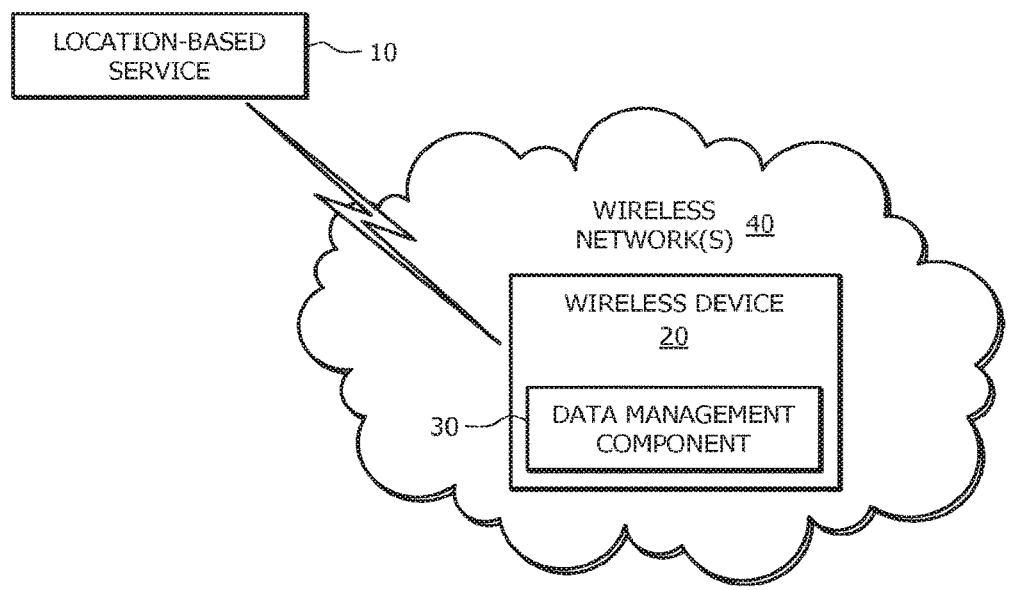
FIG. 1 is a schematic of an embodiment of a system according to at least one embodiment wherein the location-based service is outside of the wireless network.

Referring now to FIG. 1, FIG. 1 is a schematic of a wireless device 20 in one embodiment. As depicted, the dotted circle is the wireless network 40, geofenced area, or a plurality of geofenced areas and/or networks. A wireless network 40 is any type of network that can communicate with a wireless device. The location-based service 10 is outside of the wireless network 40 whereas the data management component 30 resides on the wireless device 20. The wireless device 20 is inside the range of the wireless network 40. A wireless device 20 can comprise any of the following: smart phone, pad computer, tablet computer, laptop, cell phone, key fob, vehicle, boat, or any other device that can operate on or connect to any wireless network 40. In one embodiment, the wireless device 20 is 2.5 G, 3G or 4G compliant. In one embodiment, a wireless device 20 user can receive this location-based information via SMS message, email, phone call, instant message, pop-up, voice simulations, or through any communication over the internet.

The location-based service 10 can comprise any service which provides location-based information. The location-based service 10 is capable of providing various information to the wireless device 20 or data management component 30 including location-based information. In one embodiment, a location-based service 10 can operate on or interface with wireless networks that use such standards as 2G, 2.5G, 3G, 4G, LTE, WiMax, Wi-Fi, GPS, A-GPS, or any other wireless networks or standards. Location-based services 10 can include any combination of a server, web server, vehicle, computing device, sensor, indoor sensor, motion sensor, database, network, scripts, software application, application programming interface, links or other wireless devices (e.g. desktops, laptops, computing pads, cell phones, GPS devices, or any other wireless devices capable of operating within a wireless network 40). Location-based services 10 can also comprise web-based interactions or requests, software application, application programming interface, scripts (e.g. JavaScript, ActionScript, Flash, or other scripting languages), plug-ins, applets, an application for a wireless device 20, or other suitable format for the wireless device 20 to use. Web-based interactions, in one embodiment, can include web requests, URLs, HTML, web queries, and any other communication made over the Internet. In another embodiment, the location-based service 10 can be any combination of an internet-based solution, database provided solution, network-based solution, server-based solution, software application, application programming interface, server, database, computer, applet, script, or HTML. In one embodiment the wireless network 40 can be a Wide Area Network (WAN), a Local Area Network (LAN), personal network on any type of wireless networks including a combination of any wireless networks. The wireless network 40 can also be associated with the Internet which is a certain kind of WAN. These examples are provided for illustrative purposes and should not be deemed limiting.

The location-based service 10 can be a URL, link, website, API, application, or any other type of software that operates on one or more of any of the following network, server, within cloud architecture, database, geofenced locations. In another, embodiment, the location-based service 10 comprises any combination of the following: server, database, computing device, web page, software, application, or wireless device.

In one embodiment the wireless device 20 is capable of registering with a location-based service 10, software application, wireless network 40, mobile payment system 70, geofence 60, or data management component 30. In one embodiment, the wireless device 20 is capable of registering with a location-based service 10 by initiating the location-based service 10. In another embodiment, the wireless device 20 is capable of registering with the location-based service 10 by choice or selection of the location-based service 10. In another embodiment, the wireless device 20 is capable of registering with a mobile payment system 70 either by selection of the user or by the recognition of the of the mobile payment system 70. In another embodiment, a wireless device is capable of registering by using the location-based service 10, software application, wireless network 40, mobile payment system 70, geofence 60, or data management component 30. In another embodiment, the wireless device is capable of registering with a location-based service 10, software application, wireless network 40, mobile payment system 70, geofence 60, or data management component 30 by receiving information from a location-based service 10, software application, wireless network 40, mobile payment system 70, geofence 60, or data management component 30 In one embodiment, wireless devices must be able to interface with location-based services 10 to take advantage of the services. In one embodiment, the wireless device 20 is capable of registering onto a location-based service 10 by opting into such a service. In such an embodiment, the wireless device 20 can be programmed to allow the location-based services 10 access to the wireless device 20. In one embodiment, the user of a wireless device 20 chooses to allow the wireless device 20 to use only certain location-based services 10. In another embodiment, the wireless device 20 is pre-programmed to only allow certain location-based services 10 to operate or interface with the user device. In another example, the user of a wireless device 20 prevents any location-based services 10 from interacting with the wireless device 20 for a given time, but then chooses to allow location-based services 10 to interface with the wireless device 20 for a period of time. In another example, the user can decide to register with a location-based service 10 on a case-by-case basis.

In one embodiment, the wireless device 20 is capable of registering with a location-based service 10 if it can send a web request to a location-based service 10 or website. In another embodiment, the wireless device 20 is capable of registering with a wireless network 40 wherein the wireless device 20 is able to receive location-based data from the wireless network 40 or geofenced area 60.

In yet another embodiment, the wireless device 20 is capable of registering with a first computing device 50 (not depicted). A computing device 50 can comprise an application, server, desktop, laptop, location-based service, wireless device, database, software, a link, or any combination of the same. In one embodiment, the first computing device can be a motion sensor or other device that is capable of providing indoor location-based information to the wireless device 20.

In another embodiment, the wireless device 20 is capable of registering with a location-based service 10 or wireless network 40 when it shares its position with the service or network. In another embodiment, the wireless device 20 can receive location-based information through the wireless network 40, and the wireless device 20 can provide its location to the wireless network 40. In another embodiment, the wireless device 20 can send location-based information over a wireless network 40. In another embodiment, the wireless device 20 can access the location of other wireless devices by sending a request over the wireless network 40, to a location-based service 10, mobile payment system 70, or any other device. In another embodiment, location-based information can be displayed to the user. In another embodiment, the wireless device 20 is operable to store at least some location-based information either through a memory or secure memory. In another embodiment, the wireless device 20 is operable to ascertain its location through various location determination methods In one embodiment, the use of location-based services 10 is only temporary. For example, the wireless device 20 receives a temporary application from a location-based service 10 when the wireless device 20 registers with the location-based service 10. In this example, the application can either remove itself from the wireless device 20 or cease operation when the wireless device 20 left a certain location or wireless network 40. In another example, a wireless device 20 capable of registering with location-based services 10 only needs to be able to connect or register with a location-based service 10 to use the location-based service 10. In another embodiment, once the wireless device 20 has registered onto the location-based service 10, the wireless device 20 can interface with the service. In another embodiment, the location-based service is a an application programming interface.

Location-based services 10 can vary widely and include many different software and hardware features. In one embodiment, the location-based service 10 is located within a specific location. In another embodiment, the location-based service 10 can be located outside of a specific location. A geo-fence can be created which can mark or otherwise identify a specific location or area. In general terms, a geo-fence can comprise a virtual perimeter and/or marking of a physical and/or geographical area. In one embodiment, a geofenced area 60 can also be the wireless network 40 associated with a specific location or grouping of locations (e.g. a mall, school, a county). In one embodiment, a geofence is an electronic perimeter or marking that is associated with a physical location. In general, geofences can be used to mark or identify an area or a location in order to retrieve, model, simulate, search, or identify information within the geofence area or location. The advantage of using of geofence is to identify, model, associate, or search for information that is localized or in near proximity to the geofenced location or area. Geofencing can be used to track assets, to create localized advertisements associated with the geofence, search for information, computing devices, or assets within the geofenced area, emergency services, or any other task associated with a geofenced location or area. For example, a geo-fence can be created for a school, a mall, specific stores, routes on streets or maps, oil and gas wells, oil and gas field location(s), pipelines, resorts, shopping areas, a business or businesses, classrooms, meeting rooms, geographic locations, restaurants, or any other physical location. In one embodiment, several businesses, schools, or other specific locations can be grouped into one or many geofenced areas for the wireless device 20 to interact with and/or store.

In another embodiment, a geo-fence can encompass or be associated with a route that a car regularly takes. In this embodiment and in one non-limiting example, if a user commutes to work, the geofenced area 60 is the user's commuting route. Still in this embodiment, the geofenced area 60 (e.g. the commute) is defined by a user of the wireless device 20, wireless network 40, and/or location-based service 10. In this embodiment the wireless device 20 receives location information that includes, but is not limited to the following information: traffic reports, accident reports, location of businesses within the geofenced area 60, weather reports, traffic light information, location of municipalities (e.g. bus routes, bus stops, hospitals, police stations, fire department stations, parks, and charities) within the geofenced location. These examples are provided for illustrative purposes and should not be deemed limiting.

In yet another embodiment, the geofenced location encompasses a resort. In this non-limiting example, the wireless device 20 once associated with the geofenced resort can receive location information associated with the resort that can include information such as restroom locations, dining locations, restaurant locations, night clubs, location of rides, location of ski slopes, location of any physical location in the geofenced resort, marketing information, advertisements, emergency information, whether certain attractions (ski slopes, rides, restaurants, and any other locations that resort visitors can visit) are crowded, the size of lines for certain attractions, wait times for certain restaurants, and any other information associated with the resort that users can find helpful These examples are provided for illustrative purposes and should not be deemed limiting.

In yet another embodiment, certain locations can be geofenced and associated with each other. For purposes of this embodiment, the locations can be individually geofenced or collectively geofenced (e.g. associated with each other). For example, one non-limiting example includes school campuses, buildings, or locations which are be geofenced and can share certain location information from a campus, university, building, or any other school locations. In this embodiment, any combination of certain students, administrators, teachers, or professors can provide location based information to the geofenced locations via computing devices, servers, databases, software applications, wireless devices or any combination thereof. Within this embodiment, four English classes can share information about each of the four English classes with the other classes regardless of whether they are in the same physical location. These examples are provided for illustrative purposes and should not be deemed limiting.

In yet another embodiment the associated geofenced locations (e.g. buildings on a campus) can be located in a similar general location (e.g., the entire campus). The geofenced locations then can provide location-based information to the wireless devices that are associated with the geofenced locations. In this embodiment, the wireless device 20 can also request certain location-based information associated with the general location or geofenced locations. In another embodiment, a wireless device 20 uses a software application that provides location-based information to the user about the campus such as the location of certain buildings, alerts, emergency messages or people on campus. In yet another embodiment, the geofence can be created manually or automatically. In yet another embodiment the geofence can be adaptive, contextually aware, and/or predictive. Although some of the non-limiting embodiments are discussed in terms of a school campus the embodiments can be equally applied to a business or businesses.

A wireless network 40 can be incorporated into or associated with a location-based service 10 as long as the wireless device 20 is able to use the wireless network 40. However, in one embodiment, a location-based service 10 can also be independent or unassociated with a wireless-based network. Further, in some embodiments a location-based service 10 can also use one or more databases to store location-based information. These databases can be remote in a particular embodiment or located within the specific location in another embodiment. In addition, the wireless device 20 can also store location-based information. In another embodiment, the location based service through a server accesses a database that stores certain location-based information.

Location-based services 10 can also provide information related to polls. A poll, as used herein, refers to data which has been provided by a voting population or from computing devices that send information without user interaction. These polls can relate to a variety of data including, for example, the best menu items at a restaurant in a defined location, such as a geofenced area 60, or the answer to questions either in a game, classroom, game format, or quiz format. As such, in another embodiment, the wireless device 20 can vote or send in a response to these type of polls when registered with the location-based service 10. Additionally, in another embodiment, the wireless device 20 can request if any polls exist within a certain location or the location-based service 10 can automatically provide this information to a registered wireless device 20. In another embodiment, the location-based service 10 provides adaptive location-based information. In another embodiment, this adaptive location-based information can be manipulated or searched by a wireless device 20. In another embodiment, the adaptive location-based information received by the wireless device 20 is updated based upon a pre-determined time interval. The adaptive information can be time-sensitive, location-specific, additional information sent to a wireless device 20, emergency information, inventory information, updateable information, or additional information associated with a certain location, or requests by a user.

In one embodiment, the wireless device 20 utilizes a data management component 30 to store, manage, and/or modify location-based information. A data management component, as used herein, refers to any device which stores, filters, manipulates, formats, prepares, convert and/or manages location-based information, oilfield data, profile information, or payment information. In one embodiment, a data management component 30 resides on the wireless device 20 itself. However, in yet another embodiment a data management component 30 comprises a combination of any of the following: wireless device 20, computing device, software application, application programming interface, server, database, cell tower, non-wireless device 20, or in a cloud computer architecture, etc.

In one embodiment, the data management component 30 is used to store temporary and/or permanent information. In one non-limiting example, the data management component 30 stores data related to location-based services 10 and/or geofenced locations. The data management component 30, in yet another embodiment, also serves as a cache, to store cookies from an Internet site, or other temporary information associated with a location-based service 10 and/or geofenced location. In yet another embodiment, the data management component 30 is associated with the location-based service 10 or geofenced location itself to help manage the number of users using the location-based service 10, data requests from the users associated with the location-based service 10 or geofenced location, inventory, advertisements, sales prices, revenue figures, discount percentages, storing data from a plurality of users, and calculating distances of potential physical items associated with a location-based service 10 and/or geofenced area 60 with the location of the user's wireless device 20. The data management component 30, in another embodiment, serves as a manager of real-time data or updateable data associated with the geofenced location or location-based service 10.

In another embodiment, a data management component 30 is associated with a geofenced location to manage data associated with the geofenced area 60. As used herein, the term manage means to perform an operation on, format, or otherwise store data. In another embodiment, a geofenced location is otherwise associated with a data management component 30 that is not located within the geofenced location but the geofenced location can use the data management component 30 to manage data associated with the geofenced area. In yet another embodiment, the data management component comprises a software application that is operatively connect with and populated by a location-based service where the population includes at least messages, information from local merchants in a selected or given area, information from local vendors in a selected or given area, or any other location-based information.

The data management component 30 can comprise any scripting language (JavaScript, ActionScript, etc.), HTML, XML, API, Java, C, C#, C++, servlets, applets, an application, database queries, data requests, or any other programming technology. Similarly, the data management component 30 can comprise of one or more of the following: computing device, wireless device 20, server, network, location based service, geofenced location, database, or any type of software.

In one embodiment, the data management component 30 can be associated with any type of message protocol that allows location information to be received by a wireless device 20, computing device, location-based service 10, and/or geofenced location. Similarly, the data management component 30 can also be configured to receive information on behalf of a wireless device 20, computing device, location-based service 10 and/or geofenced location. In one embodiment, the data management component 30 can be able to operate with IEEE 802.x, 802.11, et seq., 802.16, et seq., IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, CDMA, self organized network methodologies, SU-MIMO, MIMO, frequency domain equalization schemes, and any other communication protocol that supports location-based services 10 or location information. In another embodiment, the data management component 30 can provide location information to user in response to a voice command from the user.

In one embodiment, the wireless device 20 comprises a graphical map interface. A graphical map interface comprises any interface which provides a map display to the user. In one embodiment, the graphical map interface is the layout of a store. In another embodiment, the graphical map interface displays a map showing the wireless device's location in comparison to the physical location of location information on the map interface. In another embodiment, the graphical map interface is configured to display any location-based information or energy operations data on a map-like interface from any physical location. In another embodiment, the graphical map interface displays a map associated with a certain physical location, and the graphical map interface can also display additional information associated with the physical location. In another embodiment, the graphical map interface is a map. In yet another embodiment, the graphical map interface dynamically displays the location of the wireless device 20 on the map as the wireless device 20 moves to a different location. In another embodiment the graphical map interface displays updated information regarding the position of the wireless device 20 from a motion sensor and/or accelerometer.

Figure 2:
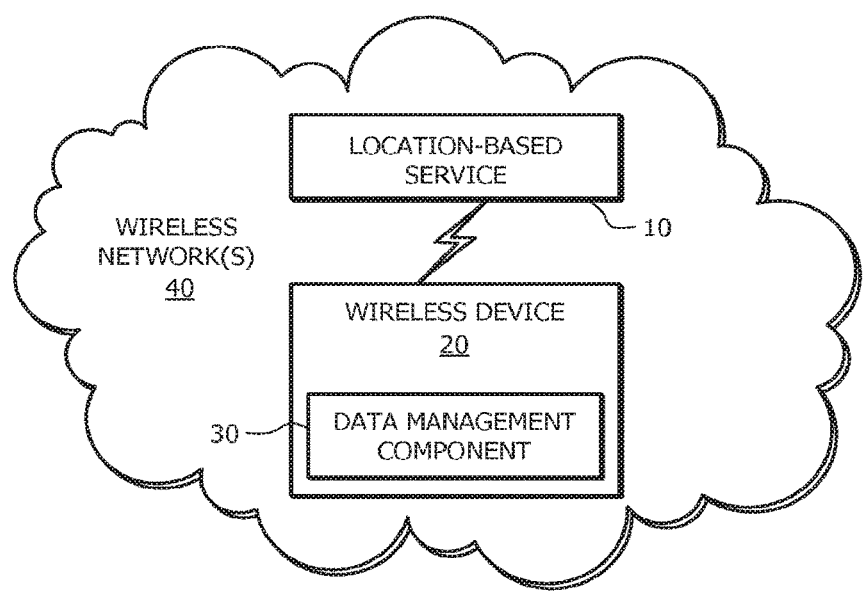
FIG. 2 is a schematic of an embodiment of a system according to at least one embodiment wherein said location-based service is within the wireless network.

There are several possible combinations of locations between the wireless device 20, the data management 30, the location-based service 10, and the wireless network 40. FIGS. 1-10 depict some of the various possible combinations. For example, FIG. 2 is a schematic of a wireless device in one embodiment wherein the wireless device and the location-based service is located within the wireless network. In this embodiment, the data management component 30 resides on the wireless device 2 which is inside the range of the wireless network 40.

Figure 3:
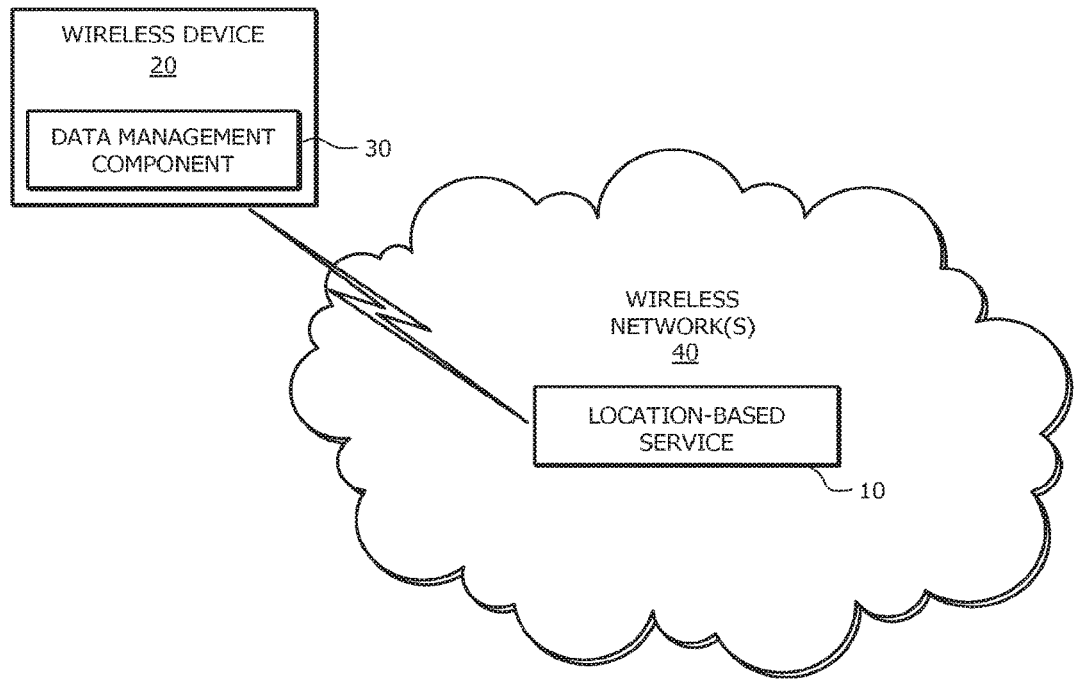
FIG. 3 is a schematic of an embodiment of a system according to at least one embodiment wherein the wireless device is not within the wireless network.

Another example is FIG. 3 which a schematic of a wireless device in one embodiment wherein the wireless device and the data management component are located outside of the wireless network. As depicted, the wireless device 20 is associated with a data management component 30 and is outside the wireless network or plurality of networks 40. In one embodiment a wireless network 40 is also a geofenced area 60. The location-based service is within the wireless network 40, plurality of networks, of geofenced area (not shown).

Figure 4:
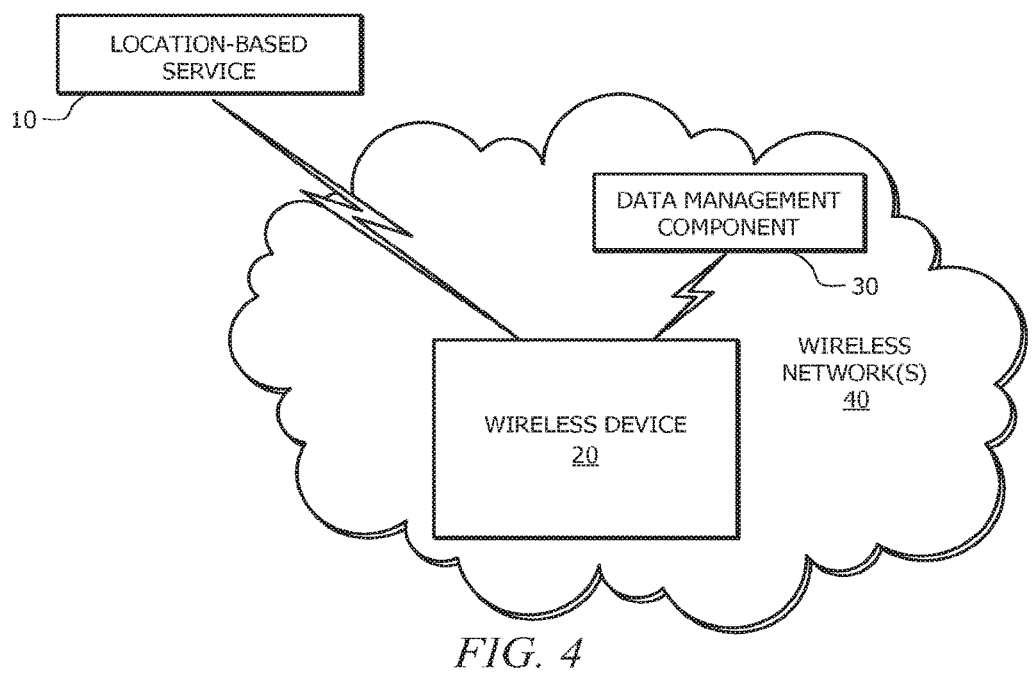
FIG. 4 is a schematic of an embodiment of a system according to at least one embodiment wherein the data management component resides within the wireless network but not within the wireless device

In FIG. 4, FIG. 4 is a schematic of an embodiment of a system according to at least one embodiment wherein the data management component resides within the wireless network but not within the wireless device. In one embodiment, a data management component is a very powerful tool that is used by a location-based service to gather, format, group, or provide location-based information to other computing devices. In this embodiment, the data management component can be a combination of hardware or software used to modify and store location-based information. One of the potential benefits of the data management component used by or within a location-based service 10 is that the location-based information is formatted converted, or grouped based upon the location of a computing device which allows for less processing on the computing device of the location-based information.

Figure 5:
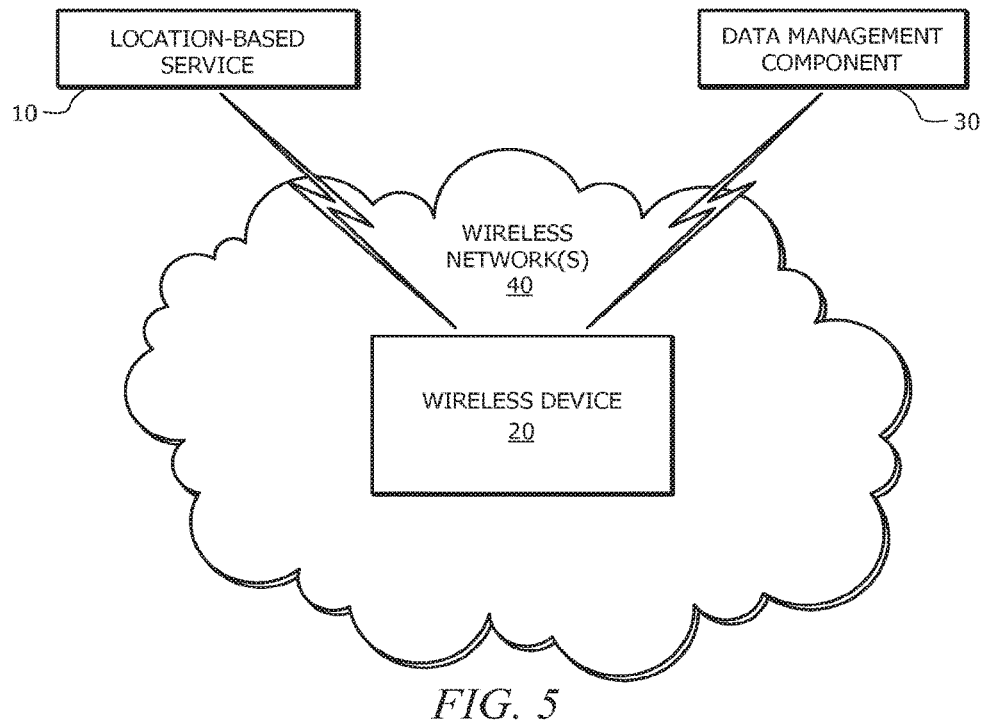
FIG. 5 is a schematic of an embodiment of a system according to at least one embodiment wherein the location-based service and the data management component are outside of the wireless network.

FIG. 5 is a schematic of an embodiment of a system according to at least one embodiment wherein the location-based service and the data management component are outside of the wireless network. The data management component 30 is outside of the wireless network 40, plurality of wireless networks, or geofenced area 60 but is associated or operatively connected with the wireless device 20.

Figure 6:
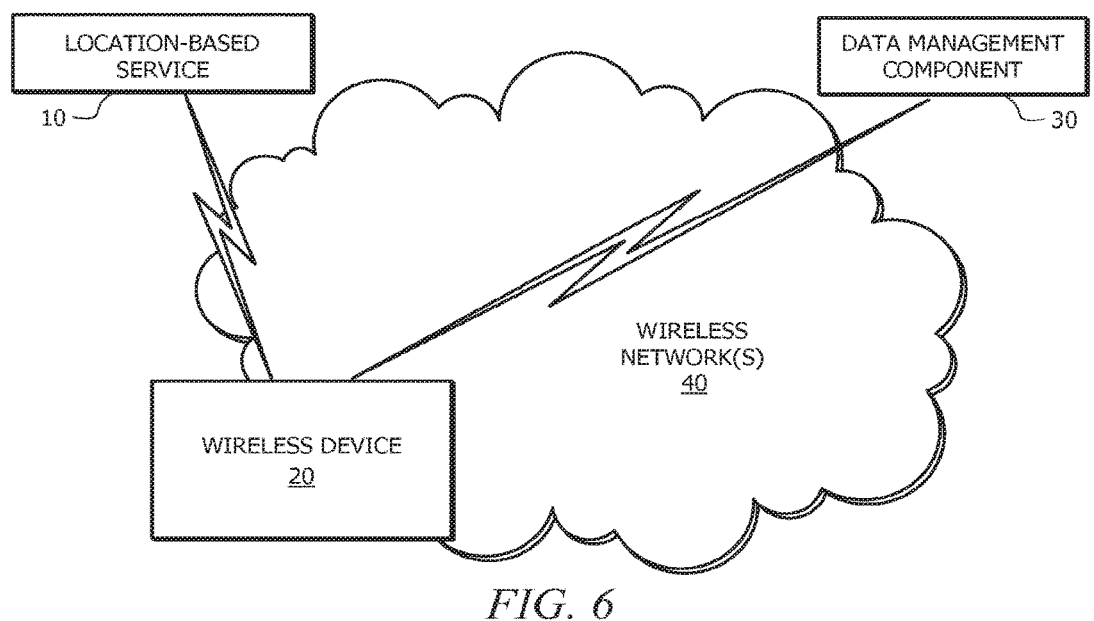
FIG. 6 is a schematic of an embodiment of a system according to at least one embodiment wherein the wireless device is within near proximity of the range of the wireless network.

FIG. 6 is a schematic of an embodiment of a system according to at least one embodiment wherein the wireless device is within near proximity of the range of the wireless network. As depicted, the location-based service 10 is outside the wireless network 40, plurality of wireless networks, or geofenced area 60 and is associated with a wireless device 20 that is in near proximity with the wireless network 40, plurality of wireless networks, or geofenced area 60. The data management component 30 is outside of the wireless network 40, plurality of wireless networks, or geofenced area 60 but is associated or operatively connected with the wireless device. In other embodiments, however, the data management component 30 and/or the location-based service 10 are located inside the wireless network 40. In one embodiment, the wireless device 20 upon being in near proximity with the wireless network 40, plurality of wireless networks, or geofenced area 60 can receive either an alert, a notification, or location-based information from either a wireless network 40, plurality of wireless networks, geofenced area 60, data management component 30, or location-based service 10.

Figure 7:
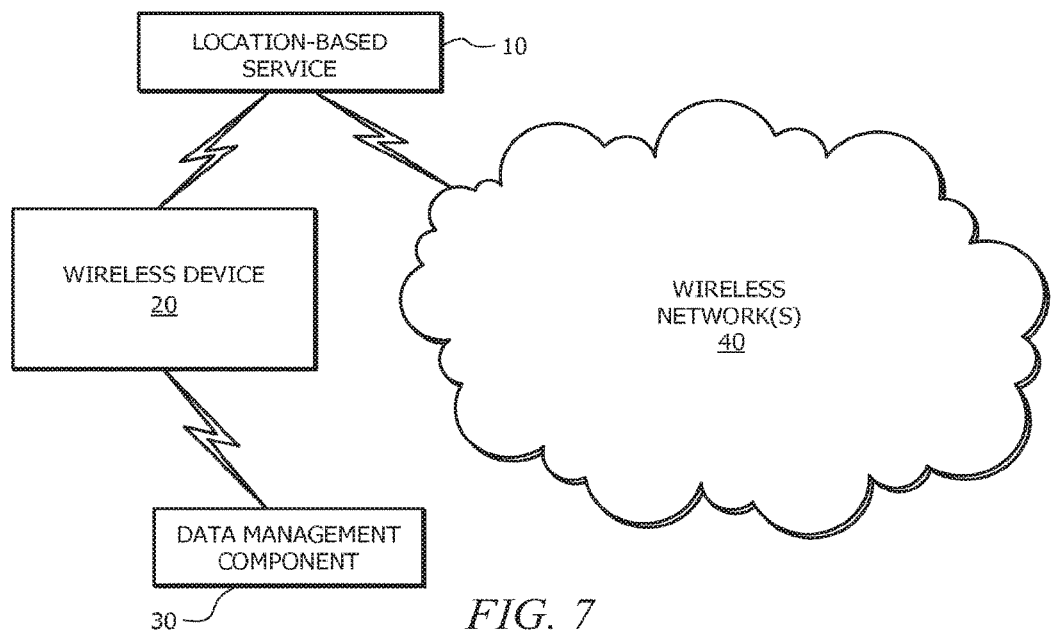
FIG. 7 is a schematic of an embodiment of a system according to at least one embodiment wherein said wireless is outside of the wireless network.

FIG. 7 is a schematic of an embodiment of a system according to at least one embodiment wherein the wireless device, the location-based service, and the data management component are outside of the wireless network.

Figure 8:
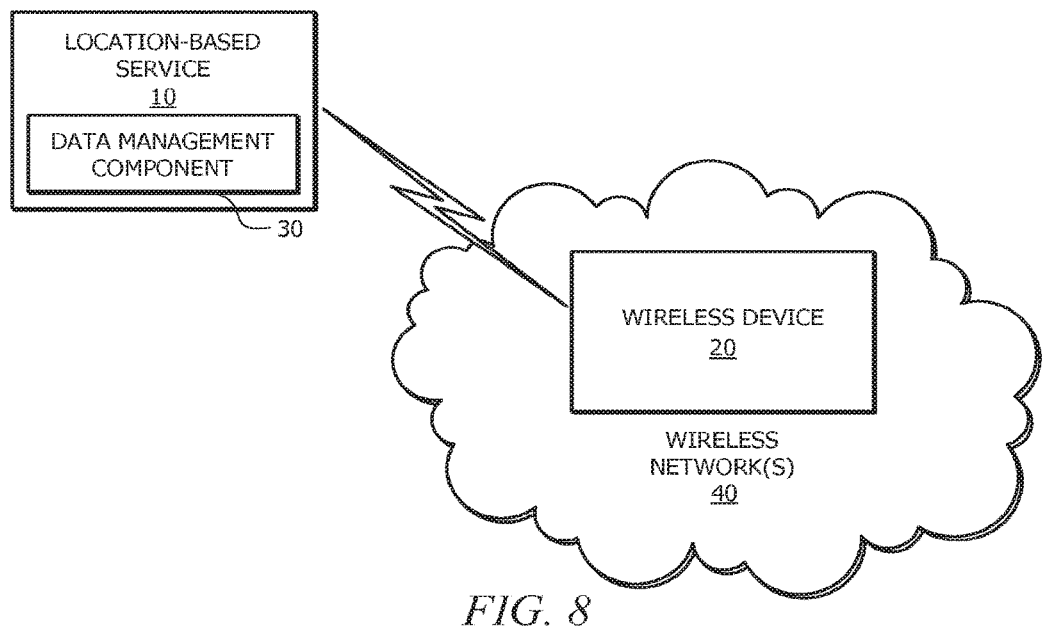
FIG. 8 is a schematic of an embodiment of a system according to at least one embodiment wherein said wireless device is within the location-based service and data management component are outside of the wireless network.

FIG. 8 is a schematic of an embodiment of a system according to at least one embodiment wherein said wireless device is within the location-based service and data management component are outside of the wireless network. As depicted, the data management component 30 is part of the location-based service 10.

Figure 9:
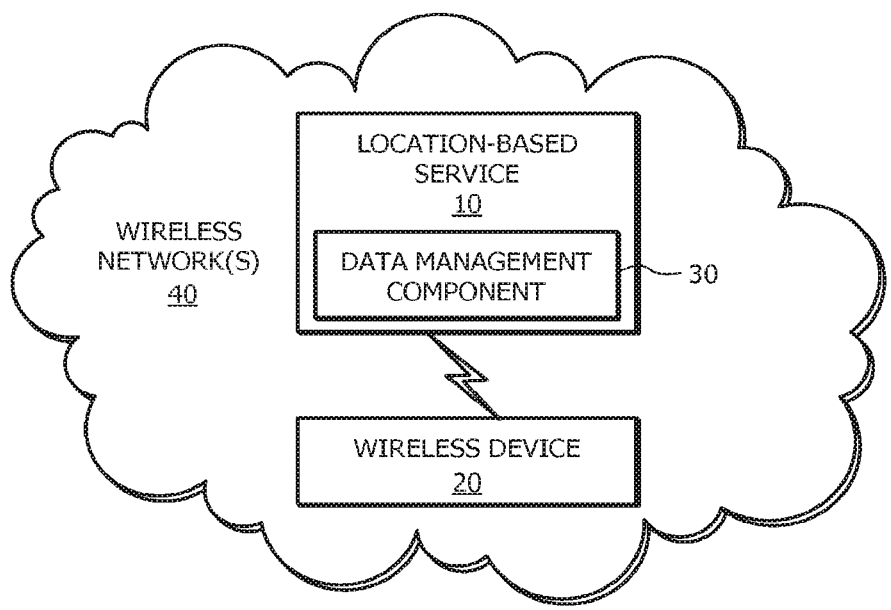
FIG. 9 is a schematic of an embodiment of a system according to at least one embodiment wherein the data management component is part of the location-based service.

Now referring to FIG. 9, FIG. 9 is a schematic of an embodiment of a system according to at least one embodiment wherein the data management component is part of the location-based service. This embodiment contemplates that the location-based service 10, data management component 30, and wireless device associated with each other through a WAN, LAN, or combination of both.

Figure 10:
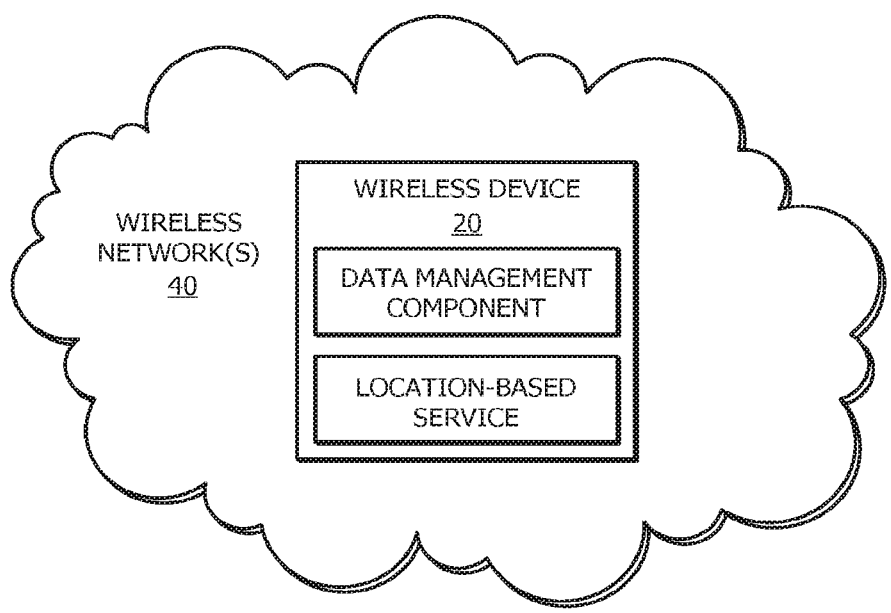
FIG. 10 is a schematic of an embodiment of a system according to at least one embodiment wherein the location-based service is associated with the wireless device.

Referring now to FIG. 10, FIG. 10 is a schematic of an embodiment of a system according to at least one embodiment wherein the location-based service is associated with the wireless device. The wireless device 20 is associated with a data management component 30 and a location-based service 10 that is configured to operate on the wireless device 20. The wireless device is configured to receive data through the wireless network 40 by associating with a wireless access point, or other access that allows the wireless device to connect to a wireless network, geofenced area 60, or plurality of each.

FIGS. 1-10 illustrate examples of the relative locations of the wireless device 20, data management component 30, and the location-based service 10. These examples are for illustrative purposes only and should not be deemed limiting.

Figure 11:
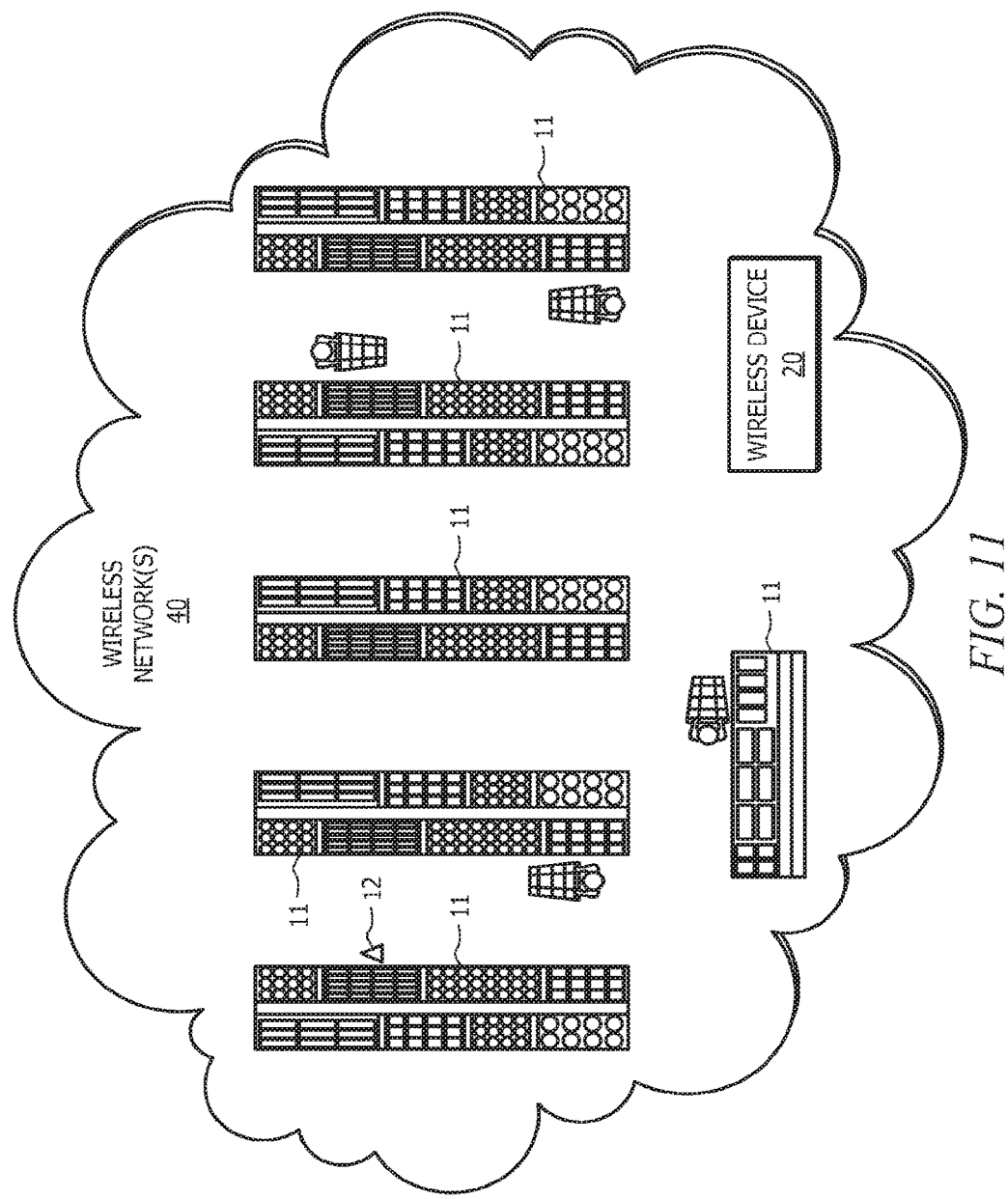
FIG. 11 is a schematic of an embodiment of a system according to at least one embodiment.
Figure 12:
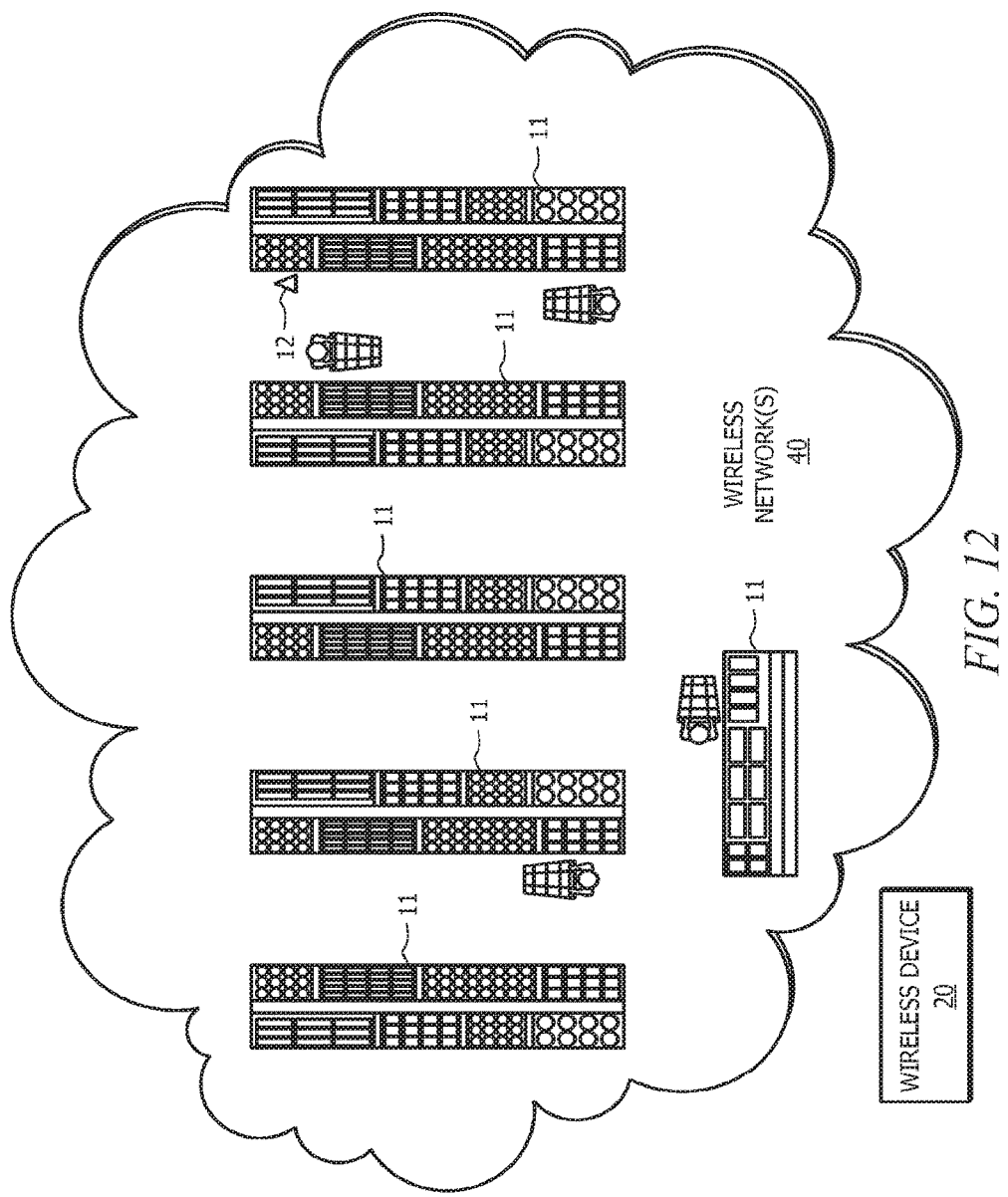
FIG. 12 is a schematic of an embodiment of a system according to at least one embodiment.

Turning now to FIGS. 11 and 12, which describe one of many methods to display certain location-based information on a wireless device. FIGS. 11 and 12 are examples of graphical map interfaces. In FIG. 11, the wireless device 20 is located within the wireless network 40, and the store comprises aisles 11, and the triangle represents the location of an item 12. A user can utilize the display on the wireless device 20 to retrieve an item 12, for example.

In FIG. 12, the wireless device 20 is located outside of the wireless network and can view the location of the item 12 on either a graphical user interface, graphical mapping interface, or other wireless device interface. In one embodiment the graphical map interface shows the location of the wireless device 20 (as shown), but in other embodiments the location of the wireless device 20 is not shown.

Figure 13:
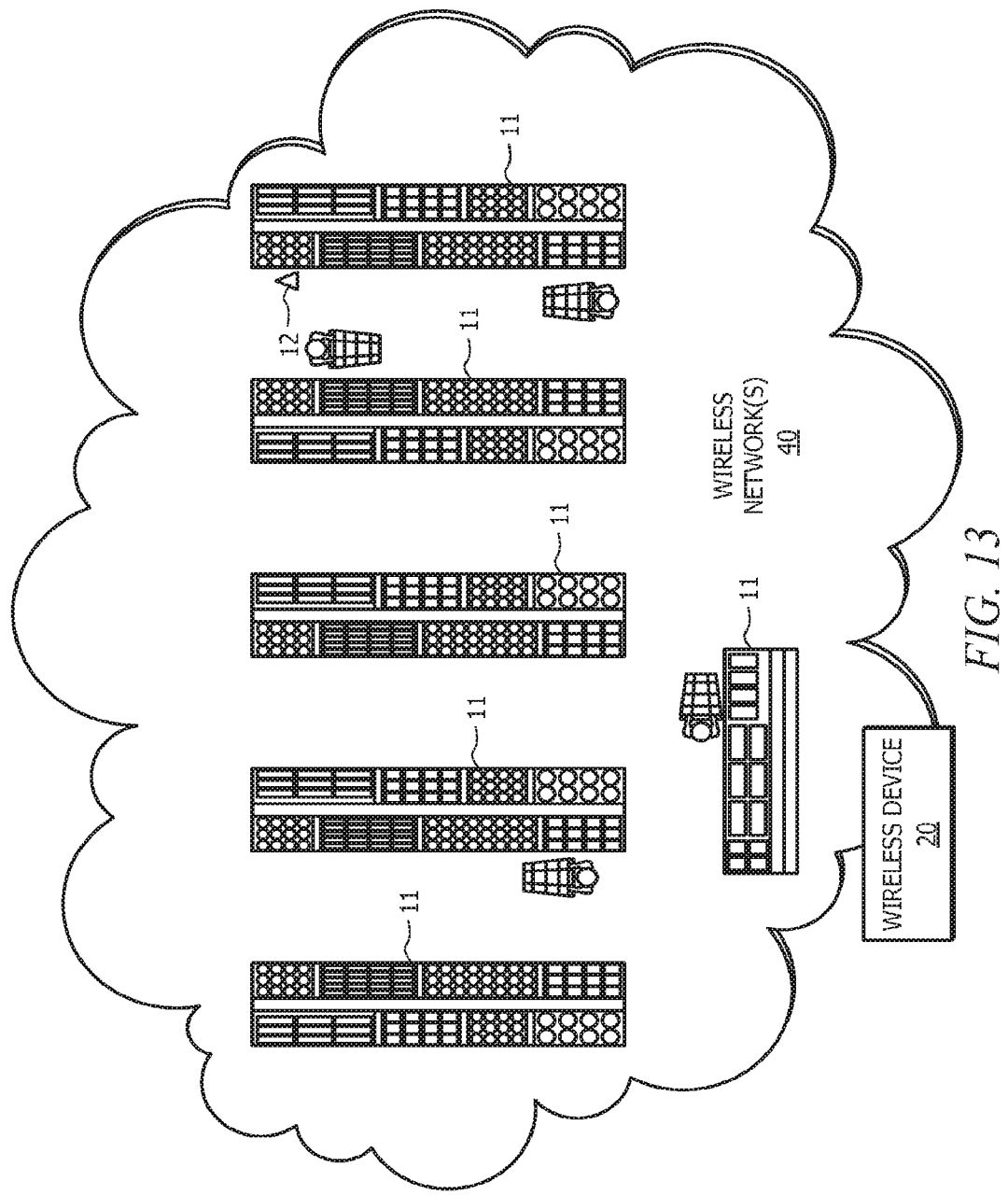
FIG. 13 is a schematic of an embodiment of a system according to at least one embodiment wherein the wireless device is in near proximity with the wireless network.

FIG. 13 represents another embodiment, wherein the wireless device is in near proximity with the wireless network and can locate or view an item 12 on an interface. FIGS. 11-13 are meant for illustrative purposes only and other interfaces can be used to incorporate the embodiments disclosures herein.

Now the operation of receiving location-based services 10, in one embodiment, will be discussed. In one embodiment, the wireless device 20 is recognized by a location-based service 10 to be within a certain location to which location-based information exists. In one embodiment, the wireless device 20 is recognized by the wireless device when the wireless device is able to receive information from the wireless network 40, location-based service 10, or mobile payment system 70, or any other component. In another embodiment, the wireless device is recognized by registering with a service or system. In another embodiment, the wireless device through a unique identifier is recognized by a location-based service. The wireless device 20 having registered with the location-based service 10 (either at the time of entering the location or before entering the location) is identified as a device within a wireless network 40 capable of receiving information associated with the specific location. In this embodiment, the user of the wireless device 20 then searches or queries the location-based service 10 for particular information and/or data associated with a location or a number of locations. In another embodiment, the wireless device 20 is pre-registered or configured to allow the use of the location-based service 10 and information or data associated with the location-based service 10. In addition and in this embodiment, location-based information is sent or is otherwise available to the wireless device 20 automatically. In one embodiment the wireless device 20 is within the location, while in other embodiments the wireless device 20 is in near proximity to the location, while in still other embodiments the wireless device 20 is not near the location at all. This embodiment thus contemplates a wireless device's flexibility in receiving information from a specific location whether the device is close to the defined location or not. In another embodiment the location-based service accesses a database that stores indoor location-based information or outdoor location-based information.

For example, a wireless device 20 user is in San Francisco, Calif. on a business trip but wants to receive location information from a mall, school, or any other location in Tyler, Tex. The location service 10, in this embodiment, is capable of providing such information to the user. This embodiment then allows the user in San Francisco to receive information related to the mall in Tyler, Tex. or know when his children were leaving school if the school was a geofenced area 60. It should be noted that this example is for illustrative purposes only and is not limiting. In another embodiment, a computing device or wireless device is associated with a geofenced area comprising energy operations data. In this embodiment, the user of the computing device or wireless device is configured to receive information that is associated with the geofenced area comprising energy operations data. Further in this embodiment, the user is able to analyze both for applying economic decision analysis and production decision analysis techniques on the energy operations data within the geofenced area. In another embodiment, economic and production decision analysis techniques are methods used to analyze how certain factors may impact the production or economic factors associated with an oil well, gas well, or pipeline. In another embodiment, the economic decision analysis and production decision analysis techniques performed using at least some energy operations data are used to predict or forecast future events associated with a drilling operation, geofenced area, or adaptive drilling profile. In another embodiment, a message is sent to a computing device or wireless device when a predefined event occurs within the geofenced area. For example and in an embodiment where the geofence is associated with energy operations data related to drilling operations, if the oil well is out of service or oil production stops for some reason, a message is sent to the computing device or wireless alerting the user of this event. In another embodiment, a user associated with a geofenced area can receive a message when a friend, asset, or event occurs within the geofenced area. In another embodiment, a user have predefined a geofenced area is capable of receiving information associated with the geofenced area. In another embodiment, a user can search for responsive energy operations data associated with a geofenced area. In another embodiment, a geofenced area can be an electronic designation associated with a given location wherein the user can request or receive information associated with the geofence area. For example, a user may define a geofenced area for her favorite apparel store. In this embodiment, the user is able to receive updates, advertisements, or other information associated with the geofenced area no matter where the user is located. In another embodiment, a geofenced area can be a resort. In this embodiment, the resort can send out announcements, emergency information, weather information, advertisements or other information associated with the resort to the user.

While in some embodiments the location-based services 10 only provides location-based information when the wireless device 20 is in near-proximity or within the specific location of interest, in one embodiment, the wireless device 20 uses or receives any type of location-based information provided by a location-based service 10. In another embodiment, the location-based service 10 is only temporarily available to the wireless device 20 when the wireless device 20 is either in near-proximity to a certain location or within the location. In this embodiment, the location-based service 10 or application can remove itself automatically or be pre-programmed to remove itself from the wireless device 20 after the wireless device 20 left the location. For example in one embodiment, the user upon entering a location where a location-based service is operable can use the location-based service while within or in near proximity to the location, but when the user leaves the application or location-based service can remove itself from the wireless device 20. In this embodiment, the user will avoid having a gluttony of icons on the wireless device that represent services or applications associated with a certain location. In another embodiment, the script or application is only interpreted or executed when the wireless device 20 in near-proximity to a certain location.

Figure 14:
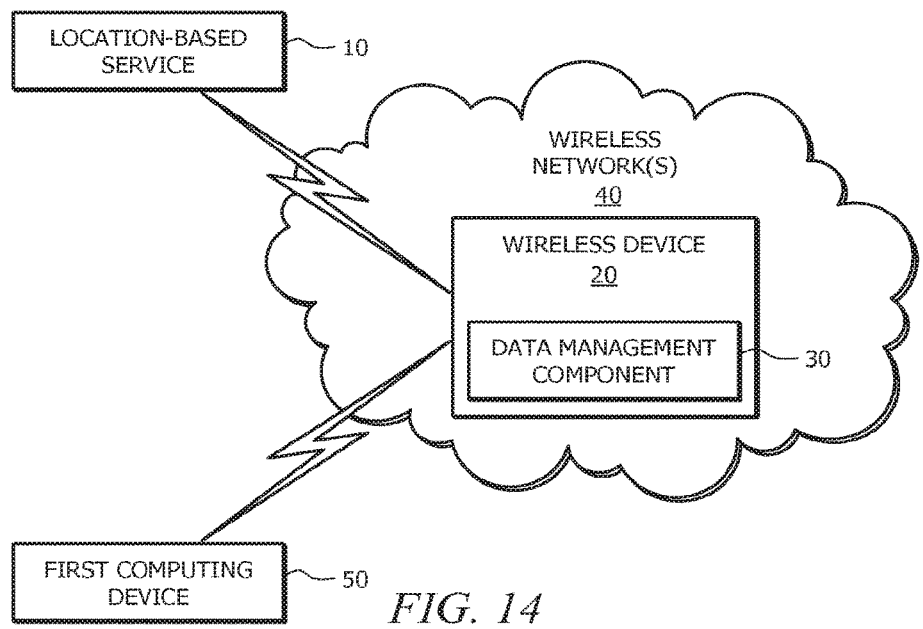
FIG. 14 is a schematic of an embodiment of a system according to at least one embodiment comprising a first computing device.

Now referring to FIG. 14, FIG. 14 is a schematic of an embodiment of a system according to at least one embodiment comprising a first computing device. As depicted, the first computing device 50 is not within the wireless network, geo-fended area, or a plurality of geofenced areas and/or networks. The first computing device 50 can provide location-based information to the wireless device 20 or data management component 30.

Figure 15:
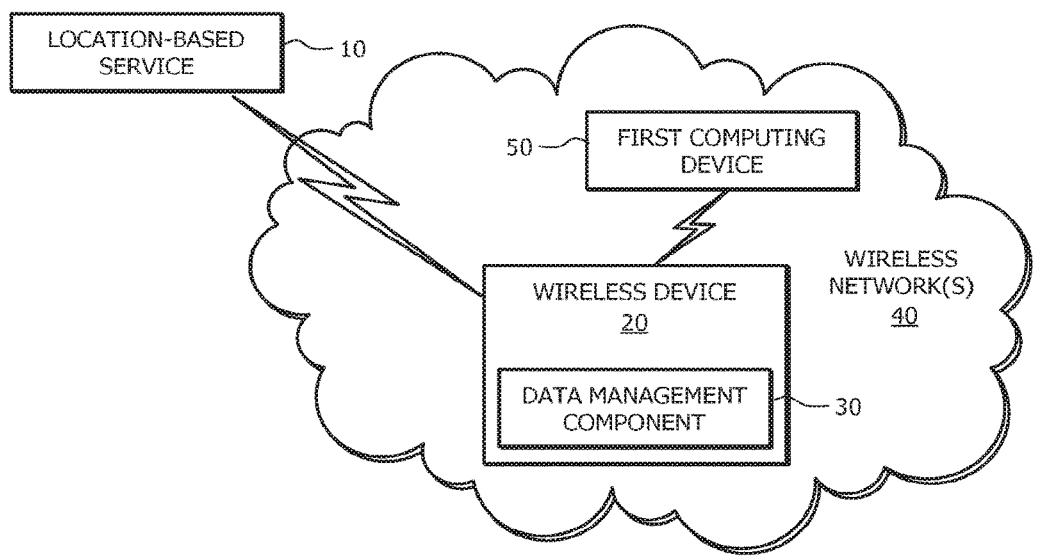
FIG. 15 is a schematic of an embodiment of a system according to at least one embodiment.
Figure 16:
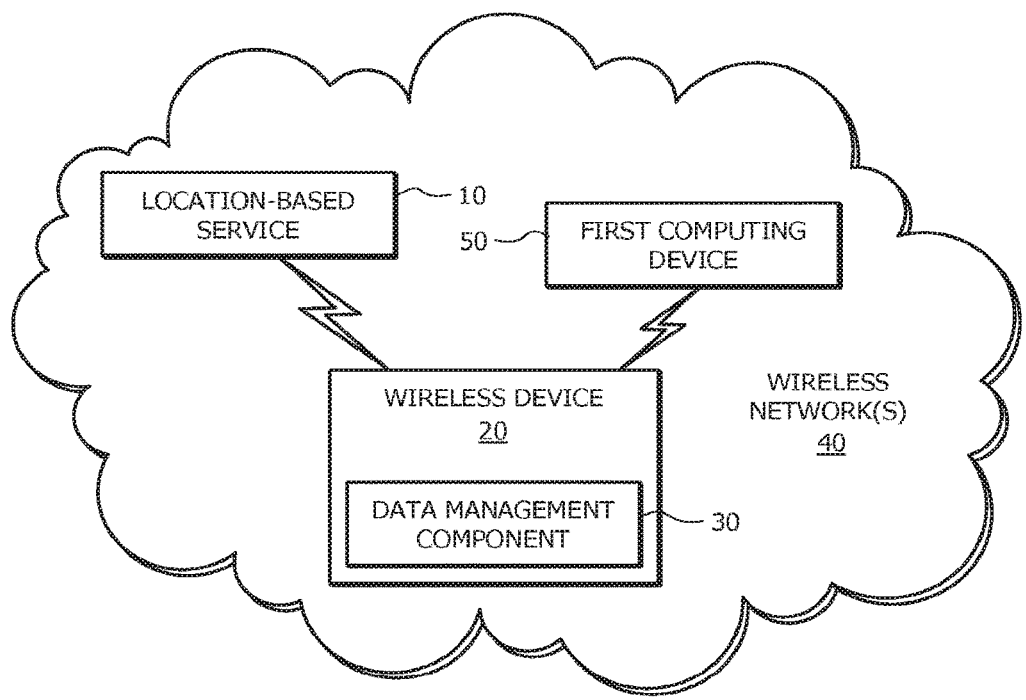
FIG. 16 is a schematic of an embodiment of a system according to at least one embodiment wherein all of the components are located within the store-based system.
Figure 17:
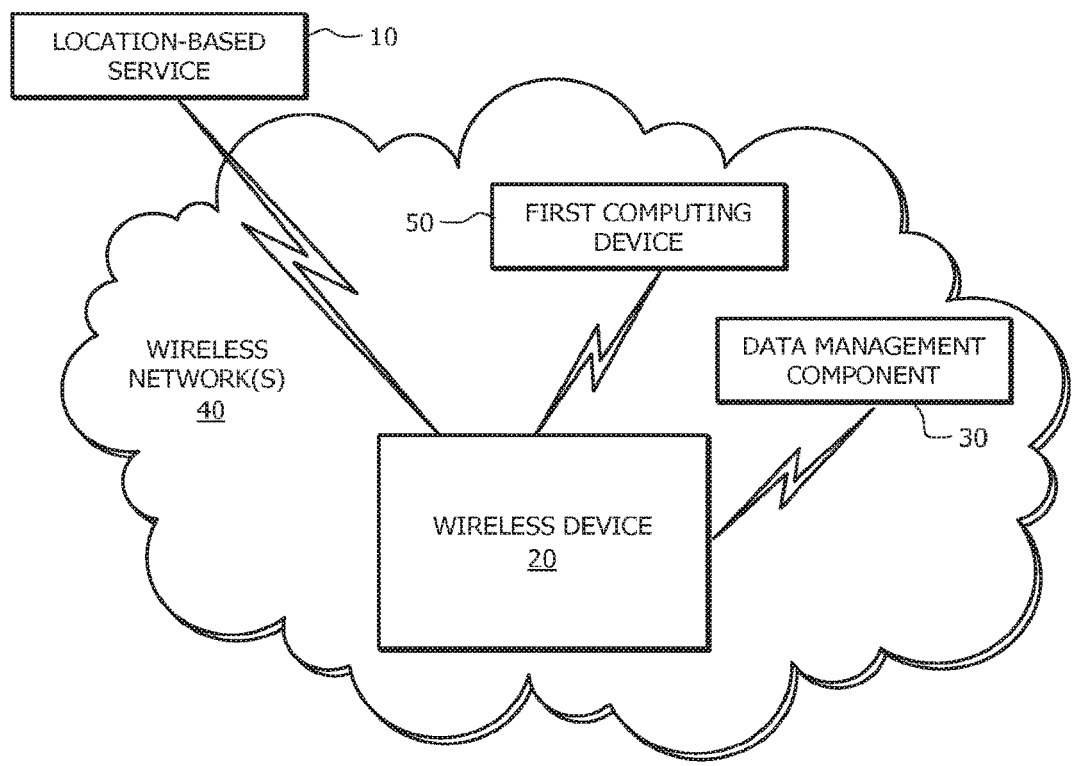
FIG. 17 is a schematic of an embodiment of a system according to at least one embodiment wherein the data management component does not at least partially reside on the wireless device but remains within the range of the wireless network.

FIGS. 15 and 16 are embodiments wherein the wireless device 20 is located within a wireless network, geofenced area, or a plurality of geofenced areas and/or networks. The location-based service 10 is outside of the wireless network 40 in FIG. 15 and inside of the wireless network 40 in FIG. 16. The data management component 30 resides on the wireless device 20. The wireless device 20 is inside the range of the wireless network. The first computing device 50 is within the wireless network, geo-fended area, or a plurality of geofenced areas and/or networks. FIG. 16 is a schematic of an embodiment of a system according to at least one embodiment wherein all of the components are located within the store-based system. FIG. 17 is a schematic of an embodiment of a system according to at least one embodiment wherein the data management component does not at least partially reside on the wireless device but remains within the range of the wireless network.

Figure 18:
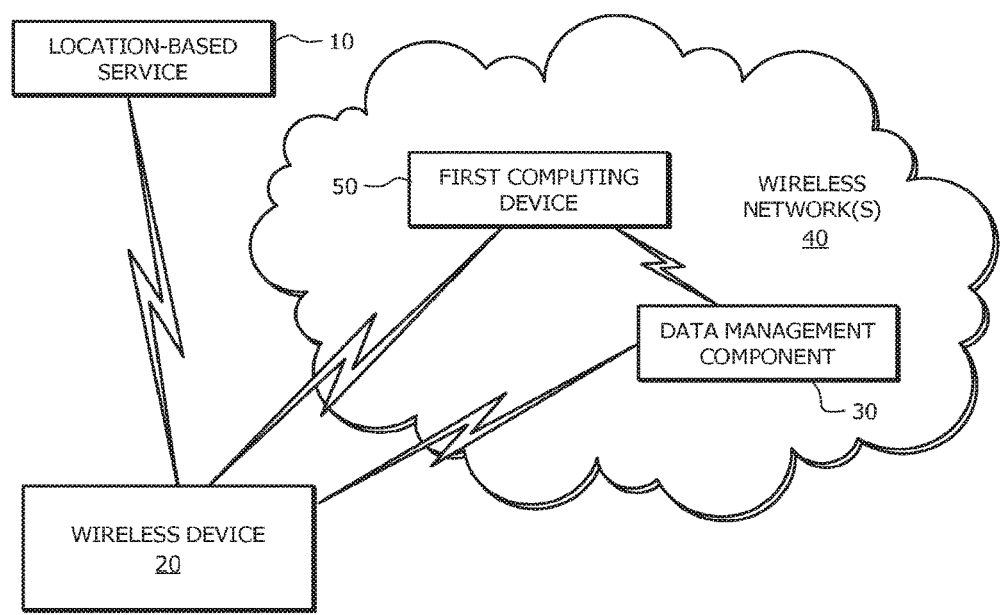
FIG. 18 is a schematic of an embodiment of a system according to at least one embodiment wherein the first computing device is within the wireless network.

FIG. 18 is a schematic of an embodiment of a system accordingly to at least one embodiment wherein the first computing device is within the wireless network. As depicted, the location-based service 10 is outside of the wireless network 40. The data management component 30 resides within the range of the wireless network 40, geofenced area, or a plurality of geofenced areas and/or networks. In one embodiment, the data management component 30 communicates with the first computing device 50. Further, the wireless device 20 is inside the range of the wireless network. The first computing device 50 is within the wireless network, geo-fended area, or a plurality of geofenced areas and/or networks. In one embodiment, the wireless device 20 is located outside the wireless network 40, geofenced area 60, or a plurality of geofenced areas and/or networks but be associated with the location-based service, which is also outside of the wireless network 40, geofenced area 60, or a plurality of geofenced areas and/or networks, and wherein the wireless device 20 can receive location-based information from the location-based service 10, first computing device 50, or data management component 30.

Figure 19:
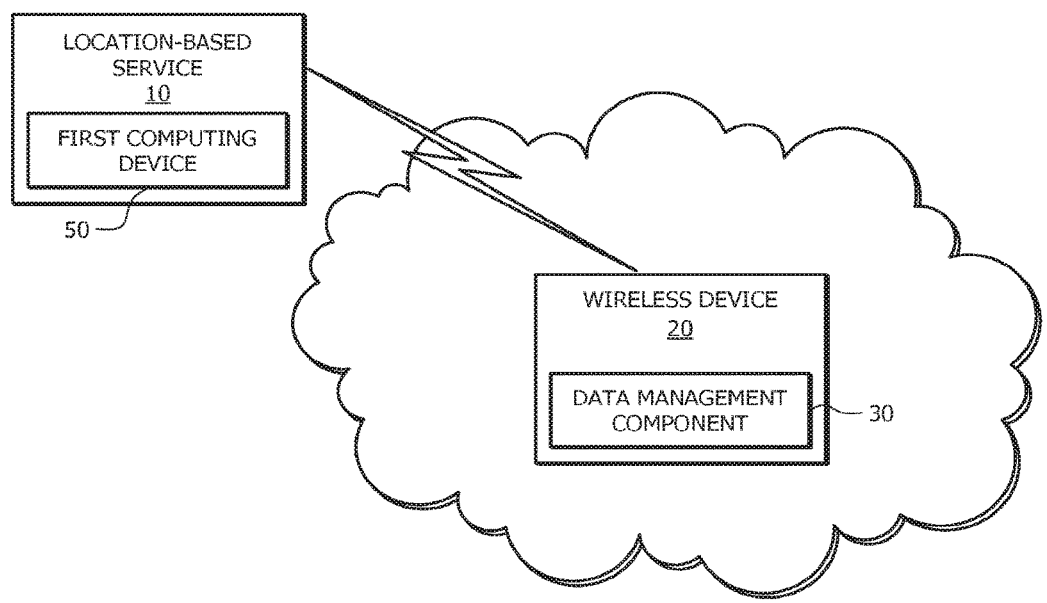
FIG. 19 is a schematic of an embodiment of a system accordingly to at least one embodiment wherein the first computing device is located outside of the wireless network.

FIG. 19 is a schematic of an embodiment of a system accordingly to at least one embodiment wherein the first computing device is located outside of the wireless network. As depicted, the location-based service is outside of the wireless network 40, and the wireless device 20 is inside the range of the wireless network. The data management component 30 resides on the wireless device 20 or is associated with the wireless device 20 and within the range of the wireless network, geo-fended area, or a plurality of geofenced areas and/or networks. The first computing device 50 is associated with the location-based service 10.

Figure 20:
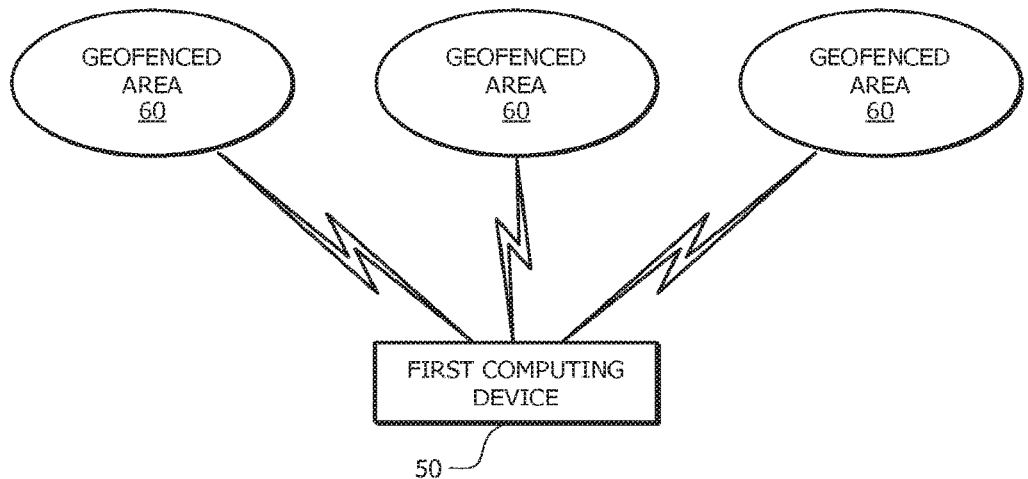
FIG. 20 is a schematic of an embodiment of a system according to at least one embodiment comprising a geofenced area and a computing device.
Figure 21:
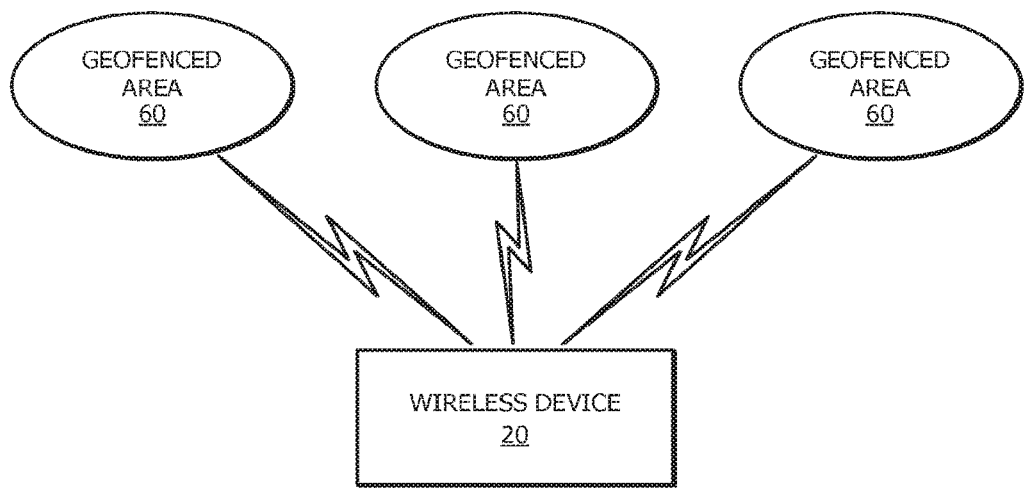
FIG. 21 is a schematic of an embodiment of a system according to at least one embodiment comprising a geofenced area and a wireless device.
Figure 22:
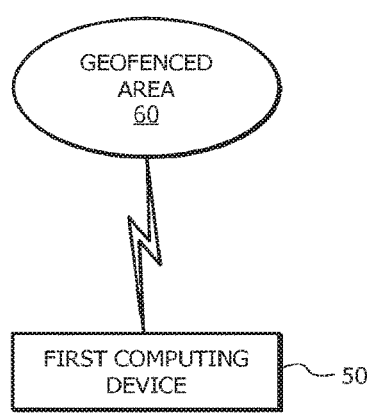
FIG. 22 is a schematic of an embodiment of a system according to at least one embodiment wherein only one geofenced area is associated with a first computing device.
Figure 23:
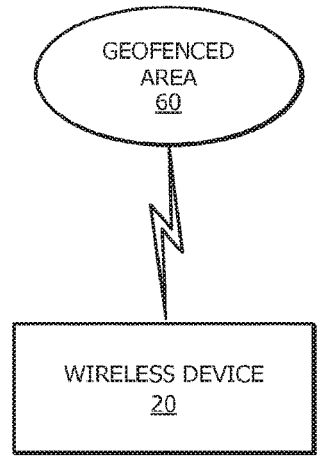
FIG. 23 is a schematic of an embodiment of a system according to at least one embodiment wherein only one geofenced area is associated with a wireless device.

FIG. 20 is a schematic of an embodiment of a system according to at least one embodiment comprising a geofenced area and a computing device. In one embodiment, and as depicted, the oval represents a geofenced area 60. As depicted there are several geofenced areas 60 but this quantity should not be deemed limiting as a single amount of geofenced areas can be utilized. FIG. 21 is a schematic of an embodiment of a system according to at least one embodiment comprising a geofenced area and a wireless device. As depicted, the wireless device 20 is associated or operatively connected to a geofenced area 60. FIG. 22 is a schematic of an embodiment of a system according to at least one embodiment wherein only one geofenced area is associated with a first computing device. FIG. 23 is a schematic of an embodiment of a system according to at least one embodiment wherein only one geofenced area is associated with a wireless device.

A wireless device 20 must merely be associated with a location-based service 10 to take advantage of the location-based service 10. In one embodiment, the wireless device 20 is associated with a location-based service 10 if it is able to receive location information from the location-based service 10. In another embodiment, the wireless device 20 is associated with the location-based service 10 if it is in near proximity or within a certain location. Still in an additional embodiment, the wireless device 20 is associated with a location-based service 10 no matter where the wireless device 20 is physically located (e.g. anywhere in the world). In another embodiment, the wireless device 20 is associated with a location-based service 10 if it can receive any information from the location-based service 10.

As previously discussed, in one embodiment geo-fencing is utilized. A geo-fence can either be created dynamically or be associated with a physical object in a static manner. In one embodiment, when a user of the wireless device 20 or a computing device enters an area that is geofenced the wireless device 20 will receive a notification (SMS text, MMS text, voice response, email, or any other type of notification) that is has entered a certain location. The notification can include information related to whether the user wants to opt-in to a location-based service 10, register with a location, receive information about the location that is geofenced, or information about other wireless device 20 users within the geofenced locations. In another embodiment, wireless device 20 or computing device users create their own geofenced areas. Within this embodiment, users are able to assign or control certain attributes of the geofenced location, including whether certain people can join the geofenced area 60, what information is displayed to the members of the geofenced area 60, and whether the members can view the information after leaving the geofenced area 60. For example, within a high school a wireless device 20 user can assign a group of lockers as a geo-fence called "lockers." In this example, the wireless device 20 user decides that the only members of the "lockers" geo-fence are the students assigned those lockers and the device user also decides what information, games, polls, symbols, insignia, or any other data that is associated with "lockers" geo-fence. In another embodiment, a location-based service can create a class schedule, assignments, enrollment information, accounting information, grades, documents and other traditional school items upon request by a user and return at least some of this information to a user via an intranet or the Internet. In this embodiment, the location-based server can search for these items based upon a geofence. In another embodiment, the location-based service is programmed to model unique location-based information based upon the adaptive profile of the user and provide the user with customized data upon request. In another embodiment, a user of a computing device or wireless device 20 can define or select a geofenced area 60 or multiple geofenced areas. In one embodiment, the geofenced areas are displayed on a graphical map interface on the computing device or wireless device 20. The user can select one or more geofenced areas displayed on the mapping interface and request additional information from the selected geofenced areas. The additional information can include any location information as well functionality associated with location information. In another embodiment, upon selection of a certain geofenced area 60 from the mapping interface, the computing device or wireless device 20 is operable to receive either additional location information, a link to additional location information, or functions associated with the location information or both. In yet another embodiment, the computing device or wireless device 20 is operable to receive updated location based information associated with a given geofenced location. In yet another embodiment, inside a certain geofenced area 60, a user tags certain points or creates certain boundaries that can provide an update when an individual, vehicle, or other wireless device 20 passes through the point or boundary within the geofenced area 60. For example, in a shopping area, a user can tag a certain location and share it with her friends and by doing so the friends could then meet at the tagged location. In another embodiment, the a wireless device 20 that is a vehicle can mark a location within a geofenced location that may be a restroom, business, or other location that the user of the vehicle wants to remember or receive location-based information from. In another embodiment, the wireless device 20, can be a vehicle and the wireless device can use the current traffic conditions as a parameter for calculating a certain route to a location. In another embodiment, the user can tag or otherwise identify a location within a geofence or wireless network 40 and associate content (text, photographs, video, or messages) with the tagged location. For example, a user may tag a restaurant and associate photograph with the location. In this embodiment, the user can choose to share this location or location with the photograph to other wireless users. In this embodiment, the user can also save the location or location with the photograph as favorite location on the wireless device 20 or with the location-based service 10. In another embodiment, a type of location-based video game can be played where physical locations within a wireless network or geofenced area/location have certain predetermined or user-determined attributes and are associated with a location-based video game that involves the geofenced area/location.

In addition, users of geofenced areas can select the permissions and rights associated with the geofenced location. For example, a user selects certain permissions that provide certain information associated with the user to be provided to other users in a geofenced location but not all information or data associated with a user to other users in a geofenced location. The ability to set certain permissions either automatically or dynamically by the user helps manage the user's geo-fence preferences. Thus, in this embodiment, a computing device or wireless device 20 itself can be configured to handle permissions and other issues related to geofenced locations automatically or dynamically without having the user's input. Conversely, in another embodiment, wireless device 20 users can also manually change the permissions and other rights associated with a geofenced location manually. In yet another embodiment, the wireless device 20 can update information it provides to a geofenced location without user input.

Similarly, in another embodiment, owners of business can set up geo-fences around a physical store or location (one or more geo-fences if necessary). Thus, in this embodiment, owners can manage the content to be displayed to users that subscribe, register, and/or enter the geofenced store location. As a result, in this embodiment, the business can provide marketing or sales advertisement to members of the geofenced area 60, games associated with the business location, a list of users at the store, a list of the inventory physically located in the store, polls for the users to take, users can also purchase items in the geofenced stores through their wireless devices, can comment on certain merchandise, can post pictures, video, and/or other media to the geofenced location. In another embodiment, users that are associated with geofenced areas (keeping in mind the users can be thousands of miles away, in near-proximity of the geofenced location, or within the geofenced location) can purchase items from the geofenced location. Similarly, in another embodiment, a business can market to members of geofenced areas whether the users are at the geofenced location or not.

In another embodiment, a geofenced location is searchable by users. For example in an embodiment, if the geofenced location is a grocery store and the wireless device 20 user is looking for cream of mushroom soup, the user upon registering with a location-based service 10, wireless network 40, and/or with the particular geofenced location searches the grocery store for cream of mushroom soup on the wireless device 20. In the present embodiment, the geofenced location or wireless network 40, either by itself of through a location-based service 10, performs a search and then returns the search results to the wireless device 20. The search results (e.g. the location of the cream of mushroom soup) can then be presented the user in a number of various formats. By way of example only and without limitation, the user can be presented with the search results by presenting to the user a map of the store with an icon showing the location of the item searched for with an icon; the search results can also be displayed on a map in 3D, through a voice-activated response system, graphical map interface, or the information can be sent to the user via a notification, message, email, video, voice response, or any other method associated with a wireless device 20.

Figure 24:
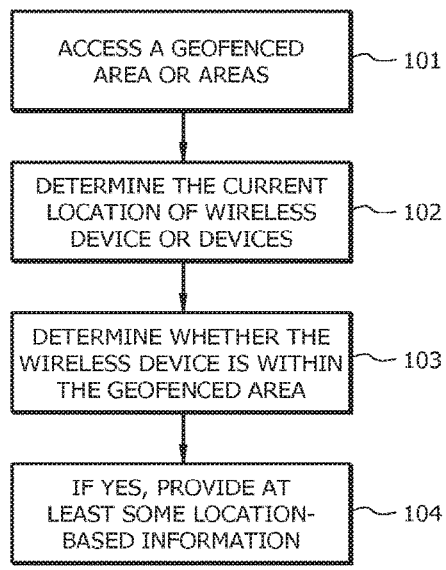
FIG. 24 depicts one embodiment of obtaining location-based information.
Figure 25:
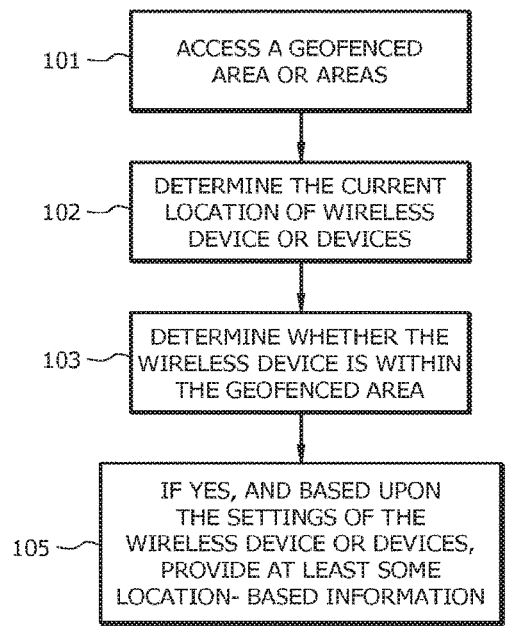
FIG. 25 depicts one embodiment of obtaining location-based information wherein the wireless device has settings.

FIG. 24 depicts one embodiment of obtaining location-based information. FIG. 24 represents a method of using location-based information that includes gaining access to a geofenced area or areas 101, once access is gained determining the current location of a wireless device or wireless devices 102, determining whether the wireless device or devices is within the geofenced area 103 and if so, providing at least some location-based information 104. In this embodiment as well as in other embodiments including FIGS. 25 and 26, the method can be performed by any combination of the following: location-based service 10, wireless device 20, data management component 30, first computing device 50, a server, a database, a wireless network, or a base station. In one embodiment, a wireless device 20 can obtain access to a geofenced area or areas by registering or simply using a server or application that allows for access to location-based information. The service or application can determine the location of the wireless device using at least one or a combination of location-determination methods. Alternatively, the wireless device is capable of determining its location using at least one or more location-determination techniques or using a motion sensor. In an embodiment, once the location of the wireless device is determined, a decision can be made on whether the wireless device 20 is within a geofence area. Upon making a decision of whether the wireless device 20, a wireless device is capable of receiving location-based information that is directly associated with a location or geofenced area. This method is useful to the extent that wireless device 20 can receive information associated with its location that may be more relevant to the user of the wireless device 20. In another embodiment, a geofence or geofences is associated with an online campus where the geofence is associated with specific programs or classes that relate to a certain topic, degree program, or class management associated with a group of people. FIG. 25 depicts one embodiment of obtaining location-based information wherein the wireless device has settings. As shown in FIG. 25, if the wireless device is within the geofenced area, then according or based upon the settings of the wireless device, then at least some location-based information is provided to the wireless device 105. For example, in one embodiment the wireless device 20 comprises settings set such that location-based information is turned off to conserve battery life. In such an embodiment, location-based information would not be provided to the wireless device 20.

Figure 26:
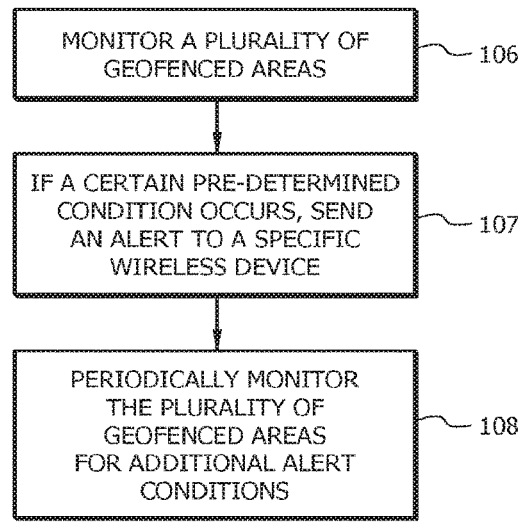
FIG. 26 depicts a plurality of geofenced areas in one embodiment.

Referring to FIG. 26, depicts one embodiment of obtaining location-based information wherein a plurality of geofenced areas are monitored. As depicted, this embodiment comprises monitoring a plurality of geofenced areas 106, and if a certain pre-determined condition is met or occurs sending an alert to a specific wireless device 107 and periodically monitor the plurality of geofenced areas for additional alert conditions that can be met 108. For example, a geofenced location can have electronic borders that have certain permissions or security settings associated with it. One example includes a bank having a secure wireless intranet in which the geo-fence marks the physical boundaries of the secure wireless network 40 such that the physical layout of the bank makes up the geofenced area 60. In yet another embodiment, the geofenced area 60 is based upon certain wireless devices identification either on a network, through the SSID, MAC address, user ID, MAC-48 identifier, EUI-48, EUI-64, IP authentication headers, encapsulating security payloads, security associations using ISAKMP, IPSec using the Security Parameter Index, or any other authentication method or any other identifying method used with wireless devices, which provides certain encryption techniques to wireless device 20 users on the geofenced location. Accordingly, a wireless device 20 user can enter the geofenced location and become a secure user of the geofenced locations intranet or network. In yet another embodiment, the user of the wireless device 20 can use a mobile payment system to purchase items within a certain wireless network 40, location, or geofenced area 60.

In yet another embodiment, geo-fencing is used to identify when a person, item, or any other tangible item either enters or leaves a certain geofenced location. In this embodiment, the person or item comprises an associated identifier that can be read by the network, location-based service 10, server(s), database(s), and/or wireless device 20 that allows for a user to receive a notification that a person and/or item has either entered or left the geofenced area 60. In another embodiment, the geofenced location can be established by a business, organization, company, wireless user or other entity/person associated with the geofenced location.

Similarly, a system comprising a wireless network 40 or having access to the Internet, and at least one geofenced location and/or a data management component 30, can perform a number of functions associated with the geofenced location such as management of data, storage of data, management of users, capable of sending, receiving or using encryption techniques (e.g. HMAC-SHA1, TripleDES-CBC, DES-based techniques CBC-MAC; OMAC, PMAC, and AES-CBC) for sales occurring within the geofenced location, monitor users' actions, manage inventory associated with the geofenced location, and identify when users leave the geofenced location. In one embodiment, a wireless device 20 or computing device can be associated with a communications link. In yet another embodiment, the communications link can select the encryption technique to be used based upon the characteristics of the communications link, the characteristics of the data to be sent over the communications link, the efficiency of a given encryption technique, or any combination of the foregoing. The system in this embodiment can be any combination of hardware including any of the following: server, database, wireless network 40, location-based service 10, computing device, and/or wireless device 20.

In yet another embodiment, a wireless device 20 is configured to receive location-based information based upon the heading or general direction of the wireless device, wherein the heading or general direction can be ascertained by a directional component residing on the wireless device. A directional component can include, but is not limited to, a microprocessor, circuit, motion sensor, compass component, or any other combination of hardware or software that is capable of ascertaining the directional movement or heading of a wireless device. This heading or general direction information is shared or provided to a location-based service 10, software application, localized terminal, server, database, or computing device. In another embodiment, a location-based service 10 receives heading or directional movement information from a wireless device, and based upon that information provide location-based information to the wireless device based upon the heading or directional movement of the wireless device. In another embodiment, the wireless device 20 executes at least part of a software application that is configured to provide location-based information to the wireless device 20 based upon the heading or directional movement of the wireless device. The wireless device 20 can also be in operative communication with an indoor location-based service that provides indoor location-based information to the wireless device based upon the heading or directional movement of the wireless device. In one embodiment, the wireless device 20 receives advertisements that are based upon the heading or directional movement of the wireless device. In one embodiment, the wireless device 20 ascertains its own heading or directional movement and requests location-based information from either a mobile payment system 70, location-based service 10, wireless network 40, server, database, or other wireless device based upon the heading or movement of the wireless device. In another embodiment, the wireless device 20 is configured to receive or ascertain data regarding its heading or directional movement and filter location-based information based upon the heading or directional movement of the wireless device 20. In another embodiment, the wireless device is operable to communicate with a software application that provides location-based information that is based upon the heading or directional movement of the wireless device 20. In another embodiment, the location-based service 10 is in communication with at least one wireless device and configured to receive heading or directional movement information from the wireless device 20. In one embodiment, a wireless device comprises a NFC-enabled data management component that is configured to initiate a communication using magnetic field induction techniques. In this embodiment, the location-based service 10 is configured to receive a plurality of headings or directional movements from one or more wireless devices and is able to determine trends, graphs, movement analytics, or analysis of the directional movements or headings to provide such information to a server, vendor, wireless device, database, or other entity.

In another embodiment, the location-based service 10 comprising a server and database is configured to receive a plurality of directional movement or heading data from one or more wireless devices through the server and send such information to be stored on the database. In this embodiment, the location-based service 10 is configured to provide reports or data that comprise trends, directional movements, headings, frequency of movements, graphs, time stamped information, directions of movements, or other directional information to another computing device or wireless device 20, which can be used for performing analysis of the data for marketing, business, or other purposes. A location-based service, in one embodiment, is configured to provide directional and movement analytics to a computing device or wireless device. In another embodiment, a location-based service, software application, or server is configured to provide location-based advertisements to a wireless device that is based upon the directional movement of the wireless device. In another embodiment, the wireless device 20 is configured to receive location-based information based upon the location of the wireless device 20 and directional movement of the wireless device 20.

In one embodiment the data management component 30 resides on the wireless device 20, referring now to FIGS. 11-13, and manages location-based information received by the wireless device 20. In this embodiment the data management component 30 serves as the manager of location-based information for the wireless device 20. Still further in another embodiment, the data management component 30 resides on the wireless device 20 and computes distances between the wireless device 20 and other tangible items located in either a location-based service 10 or geofenced area 60. The data management component 30 calculates distances using the location of the wireless (which can be ascertained through a myriad of technologies) and compare it to the location of the physical or tangible item within either a wireless network 40, geofenced area 60 and/or location based service. In another embodiment and referring to FIGS. 11-13, the wireless device is configured to calculate the distance between a physical item and the wireless device and is not associated with a data management component. In another embodiment, the data management component 30 calculates the distance of a tangible item or user by accessing a location-based service 10, tables with the associated location of the item, or other data that can provide the location of a tangible item. Referring again to FIG. 13, the wireless device can be in near proximity to a wireless network, plurality of wireless network, geofenced area 60, or plurality of geofenced areas. In another example, the data management component 30 updates itself dynamically through interactions with various wireless networks, location-based services 10 and/or geofenced locations. In this example, the data management component 30 monitors location-based services 10 and/or geofenced locations for updates on time-sensitive information, updateable information, advertisements, users within such a service or location, inventories, employees, revenues, items for sale, polls, video, photographs, and/or purchases made. In another embodiment, the data management component 30 updates the location information on the wireless device 20 without interaction required by the user. In yet another embodiment the data management component 30 is contextually aware and can receive updated location information as the wireless device 20 moves into certain locations that have either a location-based service 10, wireless network 40, and/or geofenced locations. For example, in one embodiment a wireless device that is capable of receiving or displaying location-based information is associated with a data management component 30. In this embodiment, the data management component is contextually aware because it can analyze, recognize, or even predict its surroundings or future movements of the wireless device by analyze the movement of the wireless device 20. In this embodiment, the data management component can also be contextually aware by using past locations visited by the wireless device 20, favorite locations visited by the wireless device, or positioning data stored by the wireless device to receive location-based information from a service or software application without input by the user. In one embodiment, the data management component 30 becomes contextually aware by recognizing location-based information is available based upon the location of the wireless device 20 and then request or receive location-based information without the user having to manually perform a search for location-based information. An advantage of this invention is that the burden on the user is lessened and the data management component 30 is able to receive, request, modify, calibrate, determine, format, or display location-based information with minimal input from the user. In another embodiment, a data management component is configured to use an adaptive profile to associate energy operations data with a specific area (both above ground or subterranean) that can be used or processed by a user or location-based service to create a certain display based upon the system settings or user input. In another embodiment, a data management component 30 is able to create an adaptive drilling profile associated with a geofenced location that may be provided to the user for further analysis or manipulation via a graphical user interface or mapping interface. In addition, a data management component is also configured to schedule tasks associated with processing information associated with an adaptive profile and where the data management component can determine whether certain functions should be performed using serial techniques, through parallel processing techniques, or both to be more efficiently provide data to a user.

Calculating the distance of a tangible item can be performed by any method compatible with a computing device, wireless device 20, or location-based service 10. One example is through the use of location determination methods which include, but is not limited to, cell of origin, distance, angle, location pattern recognition, or any combination of each. Cell of origin can be used to track the cell that a wireless device 20 is associated with. To improve the accuracy of the cell of origin technique cells can provide a received signal strength indication or use a highest signal strength technique. Another example of calculating the distance is through use of time of arrival methods. Time of arrival can be used to ascertain the time the wireless device 20 sends a signal to a wireless network 40. In one embodiment, the time of arrival uses an equation such as $D=c(t)$ to determine the distance between the wireless device 20 and the receiver, wireless network 40, or base station. In addition time of arrival can be used to implement a tri-lateration or multi-lateration technique. Time of arrival can also be used by a wireless device 20, wireless network 40, location-based service 10, or computing device in two-dimensional as well as three-dimensional planes. In another example, the wireless device 20, wireless network 40, computing device, and/or location-based service 10 use time of arrival to locate the wireless device 20. One possible implementation of time of arrival is represented as $TDOA_{B-A}=|T_B-T_A|=k$. This value of this equation is then used to create a hyperbola with foci, which represents possible locations of the wireless device 20. In one embodiment, multiple base stations are used to calculate time difference of arrival or observed time difference of arrival. Additional hyperbolas can be added for improved performance and one such example is the use of hyperbolic multi-lateration. Lateration can also be accomplished by using received signal strength, which can measured by the mobile device or location-based service 10, wireless network 40, base station, or a receiver. The time difference of arrival method can also incorporate antenna gains or path loss to solve the distance of the wireless device 20 and location-based service 10, wireless network 40, base station, or a receiver. Received signal strength can also be further implemented by using received-signal strength tri-lateration and multi-lateration for improved location accuracy.

Angle of arrival can also be used to determine location. The angle of arrival can be configured to use the angle of incidence to determine location as well. Multiple cell towers or base stations can calculate the angle of arrival of the signal from the wireless device 20 and use this information to perform tri-angulation after which the data can be converted into latitude and longitude or Cartesian coordinates. Location pattern techniques can also be used to ascertain the location of a wireless device 20. Location pattern techniques can use a RF profile or signature and/or signal propagation characteristics and/or possible received signal strength. Location pattern techniques can also use time of arrival, time difference of arrival, time difference of arrival-based RF signatures as well. Wireless access points can be used on the system side to sample signal strength of the mobile device. Location pattern recognition can also use an array or location vector of received signal strength values, which can be stored in a database. Location pattern techniques can also implement algorithms to find the minimal statistical distance between certain vectors or to Bayesian probability interferences. A system can be configured to comprise one of a wireless network 40, wireless device 20, location-based service 10 or cell tower to implement the above discussed location determination techniques. This system can also include an adaptive profile, data management component 30, server, or database. In particular the system can maintain a list or array of received signal strength values.

Location-based services 10 can also use various C-plane and U-plane solutions or a combination of both. Control plane or C-plan solutions can use a data management component 30 for coordination and scheduling of resources used to support location-based services 10. In one embodiment, the data management component 30 can also calculate the final location, velocity estimate, or estimates of achieved accuracy. In a control plane implementation, the network, location-based service 10, system, or wireless device 20 can also use intra-eNB and inter-eNB handovers. In one embodiment, user plane or U-plane solutions use a location terminal and enabled terminal to ascertain location. A data management component 30 can be used for coordination and to accomplish administrative functions associated with providing location-based services 10 while an additional data management component can be configured to complete the location or positioning function. In another embodiment, a U-plan solution can use the Mobile Location Protocol, Roaming Location Protocol or User Plane Location Protocol. In both C-plane and U-plane implementations, the system can use several positioning techniques including A-GNSS, GNSS, downlink positioning, E-CID, or a combination of these techniques. In one embodiment, the wireless device 20 can use GNSS or A-GNSS methods to calculate its own location. In another embodiment, U-plane methods and C-plane methods are used together to provide location-based information and/or services to a wireless device. In another embodiment, a data management component 30 can implement U-plane methods and C-plane methods together to provide improved location-based information and/or services. Thus, in one embodiment, a system comprising a base station associated with a data management component 30, a wireless network 40 providing wireless access points to wireless devices, can use C-plane and/or U-plane methods to provide the location to a wireless device 20 through the wireless network 40. In another embodiment, the data management component 30 can use either C-plane or U-plane location methods to determine the location of wireless devices. In this embodiment, the data management component 30 can be associated with a server, base station, or database to perform the function of locating a wireless device 20.

In yet another embodiment, the wireless device 20 is configured to receive indoor location-based information. Indoor location-based information can be determined using RF fingerprinting, triangulation, Bluetooth, cellular signals, or a combination of these and other such methods. In another embodiment, sensors can be used indoors to provide more accurate location-based indoor information. In another embodiment, the wireless device 20 is configured to receive indoor location-based information and display the information on a mapping interface, a text-based interface, or via a voice response. The wireless device 20 can also register with a motion sensor or location-based service that is located indoors and can provide indoor location-based information by either selectively choosing to register, logging in, opting in, authentication of the user with the sensor or service, or accepting a request to receive indoor location-based information. The wireless device 20 can also be associated with a software application that provides indoor location-based information. In another embodiment, a wireless device 20 interfaces with a sensor associated with an indoor location to send and receive location-based information. In one embodiment, a wireless device 20 becomes location aware, which means wireless devices can passively or actively determine their location. In one embodiment, the wireless device 20 can passively determine its location by requiring no user interaction or minimal user interaction. In one embodiment, the wireless device 20 is configure to passively determine its location based upon predetermined user settings or system settings of a location-based service 10, data management component 30, or mobile payment system. The advantage is that by passively determining the location of a wireless device 20 the demand on the resources of the wireless device 20 is reduce or minimized. In another embodiment, the wireless device 20 is located within a retail store or other business and within that business certain items are identified and recognized by a wireless device 20. Alternatively, sensors are located within the retail store or business and the wireless device 20 is configured to receive indoor location-based information from the identified items or sensors that relate to the retail store or business. Thus, the advantage of this embodiment is that the user can use location-based information to learn information about the retail store or business that is related to the location. In another embodiment, the wireless device 20 can send indoor location-based information to a sensor or other device within the retail store or business that can be used by the business or retail store for analytics related to the business, its marketing, its advertisements, its store layout, or staffing needs. This embodiment, thus provides a powerful tool for a business, school, or other establishment to learn more about its patrons, customers, or students. In another embodiment, the sensor, location-based service 10, or data management component 30 located within the store can receive indoor location-based information and provide such information to a location-based service 10, data management component 30, mobile payment system 70, or other device that is not located within the store for use and analytics related to the establishment, store, school, or business. Likewise, in another embodiment wireless networks are configured to be location aware. In another embodiment, a data management component 30 or wireless device 20 filter location-based information based upon user preferences, wireless network 40 settings, or the wireless device 20 history, or other settings that filter the location-based information dynamically.

A graphical user interface can also be associated with the wireless device 20. A graphical user interface can include a map interface, graphical map interface, street level interface, icon, beacon, topographical interface, grid, store, school, oilfield, oil well, text, video, or any information capable of being displayed to a user. In one embodiment the graphical user interface can include a touch screen. In another embodiment, the graphical user interface interfaces with voice commands to display location-based information. In another embodiment, the graphical user interface associated with touch screen functionality provides additional information associated with the location-based information to user based upon the user's interactions and/or selection of certain graphical displays (e.g., an icon, selection via a touch screen, address, map, beacons, applications, or any other graphical display).

In another embodiment the adaptive profile filters certain movie listings, sports scores, stocks, company news, or restaurants based upon the wireless device's location. An adaptive profile, as used herein, refers to a profile which can be adapted by the user or by a location-based service 10, database, server, computing device, other wireless device 20, data management component 30, mobile payment system 70, payment server 90, or localized terminal 80. In another embodiment, an adaptive filter associated with an application also perform these functions. In another embodiment, the adaptive profile is used to tailor the location-based information available to the wireless to the needs of the user. An adaptive profile can be used to apply user preferences selected by the user. An adaptive profile can also be used to determine security settings, the kind of location-information received by the wireless device, filtering a location-based information based upon the age of the wireless device user, and can also include profile information which is provided to a location-based service, wireless network 40, or computing device. In one embodiment, the application is temporary.

In one embodiment, the wireless device 20 comprises an accelerometer and/or motion sensor that is capable of providing location information to a wireless network 40. In this embodiment, the wireless device 20 provides updated location-information to a wireless network 40 based upon the movement of the wireless device 20. In another embodiment, the wireless device can provide updated location-based information to a location-based service based upon the movement of the wireless device. In one embodiment, location measurement units can be used to perform the function of locating the wireless device 20.

In yet another embodiment, the data management component 30 stores location information on a wireless device 20 for use in additional visits to a physical location associated with either a location-based service 10 and/or geofenced location. In this embodiment, the data management component 30 serves as a repository for location information to be stored on the wireless device 20. In this embodiment, the wireless device 20 can pre pre-programmed or programmed by the user to share certain data with a location-based service 10 upon entering or coming within near proximity of a location that the wireless device 20 has previously visited. In another embodiment, the wireless device 20 in association with the data management component 30 uses an adaptive profile to apply either dynamically, automatically, or manually to certain location-based services 10 and/or geofenced locations. For example, in one embodiment, an adaptive profile associated with the user is used for interacting with a location-based service 10, mobile payment system 70, or geofenced location/area. In this embodiment, the adaptive profile can be used to interact with these services or system where preferences or data related to the user is provided automatically or manually. In another embodiment, an advantage for the user of an adaptive profile is that it can be defined or set and then used to interact with certain services or software. In one example, an adaptive profile is used for interacting with a location-based service that displays the user's sports preferences, retail preferences, location preferences, or current location. In this example, the adaptive profile changes based upon user interactions but is also used to limit the amount of data input the user must perform. In another example, an adaptive profile could represent a handle or other public identification such as a username that is used with a location-based service 10. In another embodiment, an adaptive profile is associated with an oil or gas location and includes at least some energy operations data related to the location. In this embodiment, the adaptive profile could then be used and updated as needed based upon events at the oil or gas location. In another embodiment, an oil or gas adaptive profile is defined by a user or location-based service 10. In another embodiment, a location-based service 10 can provide energy operations data by itself or as part of an adaptive drilling profile that is in near proximity to a geographic location. In other words, near proximity means that the energy operations data relates to a general geographic location such as a county, drilling operation, or other location. Near proximity can also include data sets of energy operations data related to geographic locations that are in close relation or even adjacent to one another. In another embodiment, near proximity can include data that is related geographically within a general vicinity. In another embodiment, an oil and gas adaptive profile is used to overlay energy operations data on a graphical user interface. In another embodiment, the adaptive profile can be used in conjunction with other adaptive profiles to be displayed or used by a user of a location-based service. In another embodiment, an adaptive profile can be displayed on a three dimensional or four dimensional display, user interface, or mapping interface. In another embodiment, a location-based service 10 or data management component 30 can create an adaptive profile that is associated with a certain geographical area or location. In another embodiment, the adaptive profile is used with a mobile payment system 70 and is adaptive to the extent it can be modified by the actions of a user or mobile payment system 70. In another embodiment, the adaptive profile can be stored on a payment server that is accessible by a wireless device 20 upon initiating a mobile payment at a specific location. The adaptive profile can include privacy, security, and other settings associated with how much information is provided to a location-based service 10, network, computer, user, and/or geofenced location. The adaptive profile can be generated dynamically by the wireless device 20 or by the data management component 30. In yet another embodiment, the adaptive profile is generated using pre-selected values or tables of pre-selected values, dynamic information or any combinations thereof. In another embodiment, the adaptive profile allows the wireless device 20 to perform, at least in some manner, in a contextually aware manner and the wireless device 20 becomes contextually aware by dynamically updating the device with location information that is received from its surroundings. Security and privacy are two examples of challenges that currently face the location-based or location-aware movement. Through the use, in one embodiment, of a profile, whether adaptive or not, wireless device 20 users can protect their secure information and thereby increase their privacy when using location-based systems, services, and/or geofenced locations.

In another embodiment, the profile is set by the wireless device 20 itself based upon certain security and privacy settings of the user. In this embodiment, the wireless device 20 user selects that he/she will only share basic information with location-based services 10, network, and/or geofenced locations. In another embodiment, the wireless device 20 comprises logic to configure the profile, which can be temporary or permanent, according the user's preferences. Conversely and in another embodiment, the wireless device 20 user can choose to share the maximum amount of the user's information with the location-based service 10, network, and/or geofenced location within the context of the location-based service 10 or wireless network 40. In one embodiment, any profile, whether adaptive or not, used in association with location-based services 10, networks, and or geofenced locations can be modified to limit any amount of data provided from the user to the services, locations, and/or networks. Conversely, in this embodiment, any profile used in association with location-based services 10, network, and or geofenced locations can be modified to limit the amount of data received by the user to the services, locations, and/or networks. In one embodiment, the graphical map display is configured to display multiple adaptive drilling profiles to the user. For example and in one variation of this embodiment, one adaptive drilling profile is associated with mapping data of a given location, one adaptive drilling profile is associated with costs from the given location, and one adaptive drilling profile is associated with production or predicted production of the wells in the given location and all three adaptive profiles can be displayed to the user at the same time.

In one embodiment, the adaptive profile is associated with a payment component that is used for point-of-sale payments, mobile purchasing systems, or mobile payments system payments to certain locations. In this embodiment, the payment component can store, manage, and/or use secure payment authorizations, credit card numbers, payment accounts (e-payments), and/or other payment information associated with a user of a wireless device 20. The payment component can also use encryption as a technique for keeping the payment component private and secure. The payment component can also provide information by using the IPsec protocol. In this embodiment, the IPsec used by the payment component can also use an integrity check value, next header field, or security parameters index to protect payment information.

In yet another embodiment, the data management component 30 resides on a server and/or database or both, and serves as a data manager for all wireless devices that are associated with the a location or locations as part of either a wireless device 20, location-based service 10 or geofenced location. In this embodiment, the location (a business, social, school, oilfield, or any other physical location) decides what information to keep from users as well as what levels of security the location should employ. In this embodiment, the data management component 30 provides data to differing levels of users including members or other preferred users. This embodiment allows the location to data mine certain user information, such as helping the location's marketing efforts, inventory, payment authorizations, revenues, and/or customer service. In yet another embodiment, the location can decide which information it collects from wireless device 20 users in contact with the location-based service 10 and/or geofenced area 60. For example and in this embodiment, the location sets its location profile that include but is not limited to: the information from users to be retained by the location, the security settings of the location-based service 10 and/or geofenced location, the privacy settings of the location-based service 10 and/or geofenced location as its customers privacy settings, the encryptions methods to be used by the location, the secure sales methods to be incorporated on wireless devices visiting the location, advertisements it makes to customers based upon the customer's browsing history, favorites, profile and/or any other user-specific information. In yet another embodiment, a data management component is a powerful tool that can be used to efficiently and effectively manage secure data sets or large data sets to provide to users In yet another embodiment, the data management component 30 stores video associated with the location-based service 10 or geofenced area 60. In this embodiment, the data management component 30 can reside on the wireless device 20, server(s), database(s), network(s), the location-based service 10, and/or any combination of the same. In this embodiment, the user records video associated with a certain location and stores it on the data management component 30 associated with the wireless device 20. In another embodiment, the user can choose to upload the video to the location's data management component 30 if desired, which essentially "tags" or assigns the video to the location.

In yet another embodiment, the data management component 30 stores profile information for the user of the wireless device 20. In another embodiment, the data management component 30 can also store visit history to certain geofenced locations and/or locations on a location-based service 10 for quick access to the data concerning the locations upon the user's next visit. In this embodiment, the wireless device 20 provides the visit history automatically when associated with a location-based service 10, location, or geofenced location or can ask the user for confirmation to send visit history. In another example, the data management component 30 stores browsing history, settings relating to certain locations, as well as the user's preferences for interacting with certain locations that are part of a location-based service 10, network, or geofenced location. In yet another embodiment, data management component 30 resides on the wireless device 20 and includes an adaptive profile to be used by the user to update which information is shared with certain locations, when the information is shared, how much information is shared, how often the information is provided, settings for the security of level regarding any data provided to location-based-services, networks, determines whether the user can purchase items associated with a certain location, determines whether the user is qualified, for example being of a certain age, to purchase products or visit the location., and also can update privacy settings on the wireless device 20. In another embodiment, the data management component 30 operates on a wireless device 20 that has a multi-core processor.

In another embodiment, the data management component 30 provides profile information to a location-based service 10 or geofenced area 60 that includes age, gender, demographic information, interests, games, payment information, time-sensitive information, secure information over a secure connection (one non-limiting example is through the Secure Socket Layer or IPsec protocol) shopping preferences, transaction history, past locations visited, access to user account information using secure protocol or transmission, internet browsing history and/or preferences, other interests, etc. and combinations thereof.

In another embodiment, the adaptive profile provides profile information to a location-based service 10 or geofenced area 60 that can include age, gender, demographic information, interests, games, payment information, time-sensitive information, secure information over a secure connection (one non-limiting example Secure Socket Layer or IPsec protocol) shopping preferences, transaction history, past locations visited, access to user account information using secure protocol or transmission, internet browsing history and/or preferences, other interests, etc., and combinations thereof.

In yet another embodiment, the data management component 30 is associated with modifying, updating, storing, receiving and/or transmitting location-based information. In another embodiment, the data management component 30 is used on a wireless device 20 having a multi-core processor which enables better performance when using location-based systems and/or services compared to a single core processor. In an additional embodiment, the data management component 30 provides information for display on a graphical display or a 3D graphical display for the user. In yet another embodiment, the data management component 30 provides location-based information for transmission to the user using a computerized voice alert system.

In one embodiment, location-based information comprises any information that is associated with a certain location or locations. For example, location information can comprise traffic information, product information, financial information, advertisements, text messages, emails, inventory data, pricing, payment information, security data, frequency-divided messages, information about the address of the location (or other physical attributes), privacy settings, information associated with a web page, information associated with a server, information associated with a wireless device 20, information associated with a database, information associated with a vehicle, and information associated with a social networking service. In another embodiment, location-based information can comprise at least some energy operations data which may include lease information, production information, oceanic oil and gas data, oceanic modeling data, simulation data, oil well characteristics, oil well location, title information associated with a well (gas or oil), oil well owner, economic data, costs, manpower estimates, manpower tracking, oil well lease identification number, survey number, operator name, permits for drilling, permits for other oil and gas operations, well logs, tight sands designations, permitted commercial disposals, operator data, lease data, field name, reservoir identifier, historical operator or lease data, well depth, field depth, elevation, well type, unconventional production data, unconventional oil play data, horizontal drilling data, latitude or longitude data, cumulative production data, production averages, user profile, location profile, adaptive profile, water station locations and information associated with a water station, orphan wells, oil and gas alert. In another embodiment, location-based information can include gaming data, games, polls, votes, video, pictures, photographs, text, and any other information that is associated with a location, and combinations thereof.

In one embodiment, a wireless device 20 is configured to display information associated with oil wells, gas wells, oil and gas pipelines, and/or water stations. This data can be provided to the wireless device via a location-based service 10, software application, applet, first computing device 50, or other wireless device. The information the wireless device 20 is capable of displaying includes location-based information that can comprise, though is not limited to, energy operations data including lease information, production information, oil well characteristics, oil well location, gas well location, title information associated with a well (gas or oil), oil well owner, oil well lease identification number, survey number, operator name, permits for drilling, permits for other oil and gas operations, well logs, tight sands designations, permitted commercial disposals, water station locations and information associated with a water station, orphan wells, oil and gas alerts, any other oil and gas information associated with a drilling operation, an oil or gas well. In another embodiment, an oil well or gas well can comprise a profile for use by a computing device or a wireless device 20 that can include some of the following information energy operations data including lease information, production information, oil well characteristics, oil well location, gas well location, title information associated with a well (gas or oil), oil well owner, oil well lease identification number, survey number, operator name, permits for drilling, permits for other oil and gas operations, well logs, tight sands designations, permitted commercial disposals, water station locations and information associated with a water station, orphan wells, oil and gas alerts, any other oil and gas information associated with an oil or gas well, as well as any other location based information discussed herein and combinations thereof.

In one embodiment, wireless and non-wireless computer devices comprise the ability to search and locate specific location information. For example, in one embodiment, a user searches in a search box or text box information about a physical location, presses enter, and the search engine returns on a graphical user interface the location of certain items searched. In yet another example the user using a text box or search command line types in the street or intersection of streets, or other location identifying information such as address or coordinates, and asks for information specifically around this location. For example, in this embodiment a user can type into the search box an address (e.g., $1^{st}$ and Main St.) and the search engine returns the physical locations that are within the area of a certain street or intersection of streets. Thus in this embodiment, the physical locations can include location information, locations of restaurants, ATMs, bus stops, ski slopes, oil wells, police stations, veterinaries, parking, banks, hospitals, airports, grocery stores, or any other physical location that is within a certain range of the street or intersection of streets entered. In one embodiment the search can be limited to a specified network or geofenced location. In today's world, you can type or search on an address but the only information that is returned is irrelevant. In one embodiment, it is an unexpected advantage to allow users to search a street or intersections of street and have returned to them by the search engine information that actually relates to the intersection and/or street. In another embodiment, the information requested can be provided by the user device via a computerized voice response. For example, if a user searches for restaurants near the intersection of $1^{st}$ and main street in Tyler, Tex. the wireless device 20 provides the restaurants that are near the intersection. In another embodiment, the wireless device 20 provides results based up a certain radius.

Figure 27:
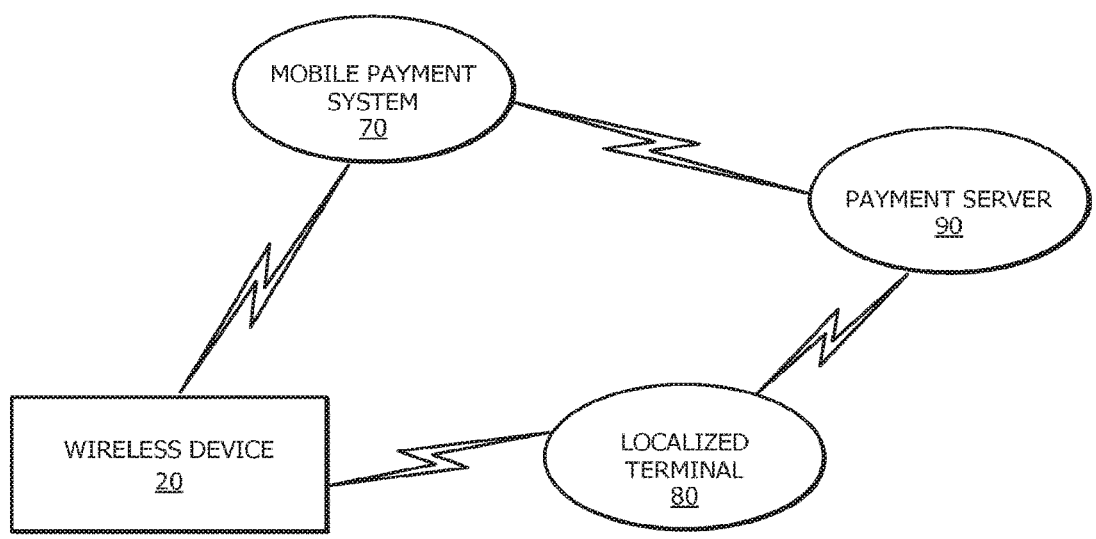
FIG. 27 depicts a payment system in one embodiment.

FIG. 27 depicts a payment system in one embodiment. The mobile payment system 70 can include a contactless payment system, SMS system, near-field communication system, an in-app mobile payment system, mobile payments, direct mobile billing system, or any combination of each kind of system that does not require the use of the magnetic stripe on a typical bank, credit, or gift card. As used herein a contactless payment system is a system which does not require swiping of the use of a magnetic stripe on a credit card or other card.

In one embodiment, the mobile payment system is a near field communication system that is associated with at least a point of sale or localized terminal. As used herein a localized terminal refers to a terminal that is used for a localized sale and includes, but is not limited to, the location at which the sale takes place. An example of a localized terminal includes a retailer, an on-line retailer, cash register, or other system that is used for mobile payments etc. A localized terminal 90 can further comprise a point-of-sale system, near-field operable device, server, database, or any other device that is used to receive or send a request to a wireless device 20 regarding an item for purchase that is within the general vicinity of the wireless device 20.

In this embodiment, the mobile payment system 70 is associated with a location-based service 10 that is associated with a wireless device 20. In this embodiment, the wireless device 20 provides the mobile payment system 70 access to secure memory residing on the wireless device 20 that is separate either through virtual segregation or physical segregation from the other wireless device memory. In this embodiment, the wireless device can register or make contact with a mobile payment system 70 having a localized terminal 80 at a given location. Once the wireless device 20 and localized terminal 80 are in communication with each other, the wireless device 20 or localized terminal 80 then creates a secure connection (one or the other, or both the localized terminal and wireless) through cryptographic techniques including but not limited to: DES-based techniques, SSL, CBC-MAC, OMAC, PMAC, AES-CBC, or SSL with a payment server 90.

In another embodiment the payment server 90 is either located locally in general proximity with the wireless device 20 or out of the generally proximity of the wireless device 20. The wireless device once connected to the localized terminal 80 or payment sever 90 can provide user payment information. As used herein user payment information includes data which is associated with the user. In one embodiment payment information includes, but is not limited to credit card number, expiration date of credit card, security code of credit card, user alias, user name, password, type of credit card, PIN number, location-based authenticated information, GPS information, phone number associated with the credit card, credit card identifier, account balance, credit history, payment history, reward card number, reward card identifier, reward card history, redeemed points associated with a reward card, redeemed tokens associated with a given purchase, reward card expiration, name of user of reward card, frequency of use of reward card, cryptographic techniques associated with the payment information, secure message headers, location-based information, price of item, quantity of item, micropayments, tokens, alerts, authentication methods, and combinations thereof.

Figure 28:
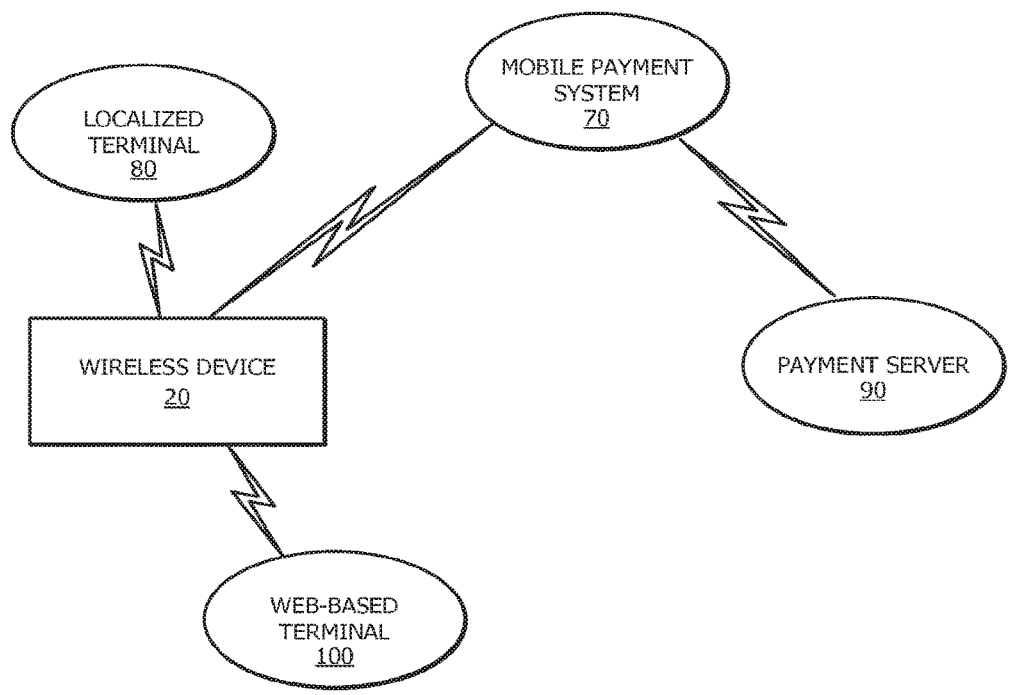
FIG. 28 depicts a payment system in one embodiment.

FIG. 28 depicts a payment system in one embodiment. As shown in FIG. 28, the wireless device 20 is in operative communication with a mobile payment system 70 and a localized terminal 80 wherein the localized terminal 80 is in the general vicinity of the wireless device 20. As used herein, general vicinity means the wireless device 20 can send and receive information to the localized terminal 80. In this embodiment, the payment server 90 receives either a payment information, authentication message, or payment request containing payment information from the mobile payment system 70 or localized terminal 80, wherein such information is at least partially obtained from the user of the wireless device 20. In return the payment server 90 authorizes a transaction based upon the payment request and provides such a confirmation message to the localized terminal 80 or wireless device 20. The payment server 90 can be used to perform settlement functions associated with the purchase that can include providing transaction details to a bank, vendor, or merchant involved in the transaction. The payment server 90 can also be used to store payment information associated with a purchase made through a mobile payment system 70.

In another embodiment, the localized terminal 80 is in communication with the payment server 90 and after receiving payment information from the wireless device 20, sends at least some payment information to the payment server 90. In this embodiment, the payment server 90 authenticates the payment information received and upon authorization of the transaction, sends a message to either the wireless device 20, a software application, location-based service 10, or the localized terminal 80 authorizing the purchase of an item within general proximity of the wireless device.

Turning to FIG. 28, as depicted, the wireless device 20 is configured to register with a payment server 90 to retrieve or at least have access to payment information associated with the user of the wireless device 20. In this embodiment, the payment server 90 provides payment information to the wireless device 20 upon either receiving a request for payment information from the user or without receiving a request from the user. In this embodiment the wireless device 20 then either communicates with a localized terminal 80 or web-based terminal 100 to provide at least some payment information to the localized or web-based terminal and after providing such information to the terminal, the wireless device 20 receives a payment confirmation that is displayed to the user of the wireless device confirming purchase of an item in the general proximity of the wireless device.

In another embodiment, the wireless device 20 can comprise an adaptive profile that is associated with payment information for the user of the wireless device with a mobile payment system 70 or localized terminal 80. In another embodiment, the adaptive profile is associated with an alias, password, or username and is used to automatically populate payment fields provided on the interface of the wireless device in preparation to purchase an item through either a localized terminal 80, web-based terminal or mobile payment system 70. In another embodiment, the payment information comprises account information associated with a prepaid account In another embodiment, the payment server 90 comprises a virtual interface for accessing payment information associated with a wireless device to be used in making a mobile contactless purchase. In another embodiment, the payment server 90 is associated with a cloud-based architecture and is accessible by the wireless device through the internet, local area network, or wide area network.

Payment information can be hosted by a server that is accessible via a virtual interface, such as a cloud-based interface, for making a mobile purchase. In another embodiment, the localized terminal 80 comprises a near field communication component and/or a barcode component. In one embodiment, the bar code component is configured to receive information associated with a bar code, square bar code, QR code, or other codes. In one embodiment, the user is able to access her payment information through a virtual interface that is hosted by a server, webpage, or database. In this embodiment, the user can view her payment information through the virtual interface while minimizing the number of interactions the user's wireless device has with the server, webpage, or database. In another example, the user may be able to modify her payment information on the virtual interface and when complete the payment information can be stored through or by using the virtual interface. In another embodiment a virtual interface can be a secure virtual interface and used for making mobile payments. In another embodiment, a virtual interface can be used with or to present energy operations data. In another embodiment, the wireless device 20 is associated with a first secure memory that is located on the wireless device 20 and a second secure memory that is either located on the wireless device or in operative communication with the wireless device 20. In this embodiment, the first secure memory is used to store adaptive profile information that is subject to payment preferences associated with the user and is accessible by the wireless device for interaction with a localized terminal 80 or mobile payment system 70. In this embodiment, the second secure memory is used to authenticate, verify, or perform encryption techniques in order to initiate a mobile payment. By having two secure memories in this embodiment, the wireless device 20 can process mobile payments in a more efficient manner. In another embodiment, the wireless device 20 can initiate a mobile payment or opt in to another location-based service by movement of the wireless device 20. In this embodiment, the movement close to a terminal or localized terminal 70 can initiate the interaction with the mobile payment system or other location-based service. In this embodiment, the movement of the wireless device can be ascertained by use of a multi-axis motion sensor associated with the wireless device 20 or through use of any other contactless system located within the near proximity of the wireless device. Upon initiation of the location-based service or mobile payment system the wireless device is configured to receive, modify and store location-based information or payment information received by the wireless device with minimal user interaction. In this embodiment, the wireless device 20 can apply the information received by the wireless device 20 to a user's adaptive profile that is used to interact with a location-based service 10 or mobile payment system 70. In this embodiment, the adaptive profile is used to manage the user's encryption policies or security policies associated and can be modified based upon the information received from the mobile payment system 70 or location-based service. In another embodiment, wireless device is configured store payment information using one or more encryption techniques on secure memory for use with information received from a location-based service 10 and in turn the information from the secure memory and the location-based service is modified to be used with a mobile payment system 70.

In another embodiment, the near field communication component is configured to operatively connect to a wireless device in near proximity to a localized terminal 80 or near-field device based upon a movement of the wireless device 20 or request sent by the wireless device 20. In another embodiment, the wireless device 20 operatively communicates with a payment server 90 to authenticate and authorize a payment from a wireless device without the need to physically access a credit card or other payment card and upon receiving a response from the payment server 90 that comprises authorization information, the authorization information is sent to the localized terminal to complete the purchase. In one embodiment, the user need not have to swipe a card, pull a physical card from a physical wallet, or physically contact a physical card to a localized terminal 80 or payment server 90. This is an example of a contactless payment system.

In another embodiment, the wireless device 20 reviews payment information on a graphical user interface, graphical mapping interface, or any other type of interface used by a wireless device. In yet another embodiment, the wireless device 20 is configured to display payment information associated with a given purchase or request for purchase to the user of a wireless device. The user can also be able to confirm the purchase via voice command, pressing of a touch-screen icon, pressing enter, or any other method to confirm the purchase request or purchase. In another embodiment, the payment information that is displayed to the user is pre-fi lied by a payment server 90, location-based service 10, software application, secure memory, memory on the wireless device, localized terminal 80, sensor, database, server, or other wireless device upon initiation of a mobile payment session or request to make a mobile purchase. In another embodiment, the wireless device 20 is associated with one or more payment servers 90, mobile payment systems 70, location-based services 10, or localized terminals 80. The wireless device 20 can use a tapping, knocking, or other movement to initiate a payment, payment request, or request for additional information to interact with a localized terminal 80, mobile payment system 70, or payment server 90. In one embodiment, the wireless device can be waved near or tapped against a localized terminal to initiate a contactless payment. In one embodiment, the wireless device can send an initiation message to the localized terminal 80 or the localized terminal 80 can send an initiation message or request. As a result, a mobile payment can then be processed or at least requested in this embodiment, This example, thus illustrates how easy a contactless payment can be initiated in one embodiment of the present inventions. In another embodiment the localized terminal 80 or mobile payment system 70 can use user plane and control plane techniques to authenticate the user of the wireless device 20. In another embodiment, the wireless device 20 is configured to use control plane and user plane techniques to register with a location-based service or to authenticate the user with a localized terminal 80 or mobile payment system 70.

When interacting with a mobile payment system 70, in one embodiment, the wireless device 20 displays available payment accounts and rewards cards to the user on a graphical user interface or graphical mapping interface. The payment accounts and reward cards can also be displayed to the user based upon the preference of the user, the frequency of use of the user, or in another user-selectable format. In another embodiment, the wireless device 20 displays the payment status, account information, and reward card information to the user at the same time. In another embodiment, the user views adaptive profile information, authentication message or authorization information in any combination or at the same time. The wireless device 20 that is associated with an adaptive profile, can use the adaptive profile to store credit card information, reward card information, coupons, account statement, user payment information, purchase history, location history regarding mobile transactions, payment alerts, promotions, user or any other financial information associated with a user of a wireless device to interact with mobile payment systems, and combinations thereof. In one such embodiment, the adaptive profile interacts with either the secure memory of the wireless device 20, location-based service 10, localized terminal 80, web-based terminal 100, or mobile payment system 70 to store certain adaptive profile information. The wireless device can be configured to change security setting associated with a mobile payment system on a the basis of location, time settings, or interaction of the user with the wireless device. An adaptive profile, in one embodiment, is associated with a mobile payment system 70 and is configured to determine which profile information to provide to a localized terminal 80, location-based service 10, or payment service. In one embodiment, the adaptive profile associated with a mobile payment system 70 is stored by a location-based service 10 or other service having a virtual interface accessible by the wireless device 20 and at least some adaptive profile information can be provide to the wireless device upon attempting to make a mobile purchase. An adaptive profile is adaptive because it can be modified by either the user or other system that has access to it.

In one embodiment, a mobile payment system 70 includes a location-based service 10 that is configured to provide location-based information to a wireless device 20. In another embodiment, a mobile payment system 70 is configured to allow for mobile web payments through the internet, a local area network, or wide area network. The mobile payment system 70 can reside on the wireless device, wherein the wireless device comprises a near-field communication chip, wherein the mobile payment system 70 can use near-field communication for receiving payment information from a user of the wireless device. In another embodiment, the wireless device is in communication with a localized terminal 80 that is configured to receive a payment request from the wireless device to purchase an item within the general vicinity of the wireless device. In another embodiment, a software application in communication with a wireless device 20 and location-based service 10, and configured to receive location-based information from the location-based service 10 that includes physical items prioritized by a unique identifier based upon sales of the item or items within the given location and where the software application is configured to provide such information to a wireless device creating a customized list, catalog, electronic circular, or min-catalog of most popular items for sale or lease. In this embodiment the user can decide to purchase an item associated with the location-based information through a mobile payment system 70. In another embodiment, the mobile payment system 70 can be used for person-to-person, person-to-business, or business-to-business transactions.

In yet another embodiment, the mobile purchasing system 70 is operatively connected to a location-based service 10 wherein the location-based service provides location-based information to the mobile purchasing system 70 that is either associated with the user, an item within a general vicinity of the wireless device, or payment information for purchase of an item by the user of the wireless device 20. In another embodiment, the localized terminal 80 is operatively connected to a location-based service 10 that is either within a local vicinity of the localized terminal 80, wireless device 20 or remote to either the wireless device 20 and localized terminal 80 and is configured to provide location-based information to the localized terminal or profile associated with the user of the wireless device for payment authentication or authorization. In another embodiment, the mobile payment system 70 is connected to one or more location-based services 10 where the first location-based service is configured to provide location-based information to the mobile payment system 70 or localized terminal 80 comprising advertisements or offers to sell and the second location-based service is configured to provide payment authentication or authorization information to a mobile payment system 70 or localized terminal 80. In one of such embodiments, the mobile payment system 70 is configured to send an advertisement to a wireless device 20 based upon the location of the wireless device 20 and authorization or authenticate a transaction involving an item that is within the general vicinity of the wireless device 20. In one embodiment, the wireless device 20 is in operative communication with a location-based service 10 wherein the location-based service is configured to provide a user's adaptive profile to the wireless device 20 and comprises payment information associated with the user. In this embodiment, the wireless device 20 is then configured to use the adaptive profile to make a payment to a mobile payment system without a localized terminal 80 or through a localized terminal 80 that is in operative communication with a mobile payment system without the need of swiping a physical card or using a magnetic strip at a localized terminal within near vicinity of the wireless device. Further in this embodiment, the wireless device 20 through the location-based service 10 or software application is operable to provide a confirmation message to the user of the wireless device that is selectable by the user to confirm a purchase of an item within near vicinity of the mobile device.

In another embodiment, the wireless device is associated with a mobile payment system 70 that at least partially comprises a software program that resides on the wireless device 20. In this embodiment, the mobile payment system 70 is configured to store an adaptive profile associated with the user of the wireless device 20 that comprises either an alias or other name or number that represents account identification associated with a user of a wireless device. In one of such embodiments, the mobile payment system 70 uses various authentication methods including but not limited to proximity authentication, account authentication, location-based authentication, communication authentication. NFC-based authentication or other known authentication methods to verify any message received by the wireless device from a localized terminal 80, payment server 90, or location-based service 10 that represents settlement of a certain purchase request made by the mobile payment system 70.

Figure 29:
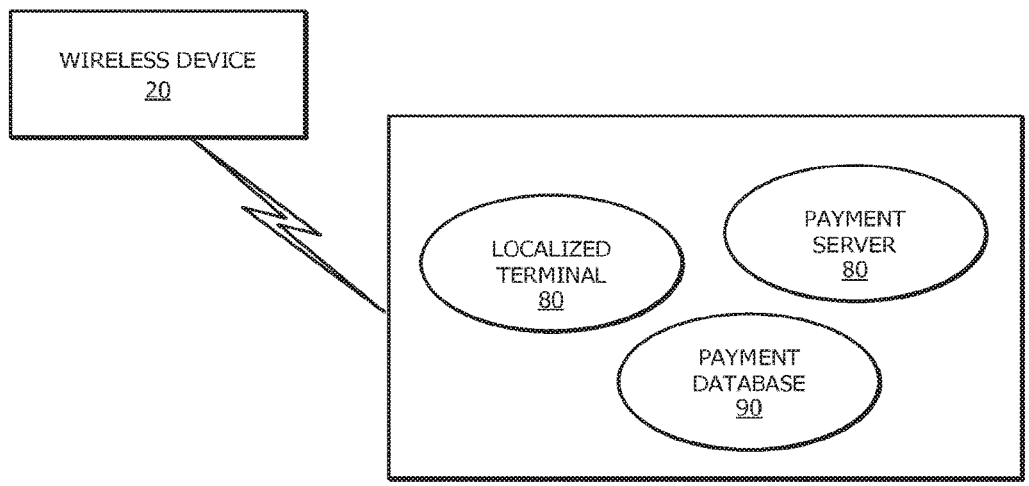
FIG. 29 depicts a payment system in one embodiment.

Turning to one embodiment as referenced in FIG. 29, the wireless device 20 is in communication with a mobile payment system 70 that comprises a localized terminal 80, payment server 90, and payment database 110. In this embodiment, the wireless device 20 is configured to register with a mobile payment system 70, provide payment information to a mobile payment system 70, send an authentication message to the mobile payment system, and receive payment, authorization, authentication, or confirmation messages from the mobile payment system 70. In this embodiment, the localized terminal 80 after recognizing the wireless device 20, is configured to receive information from a payment server 90 regarding encrypted or non-encrypted payment information from the payment server, that in turn at least some of the payment information is provided to the wireless device 20 through either the localized terminal 80 or payment server 90. In this embodiment, it may be useful for a localized terminal to receive payment information associated with a user in communication with a localized terminal 80 from a payment server 90. In this embodiment, the payment information could comprise secure payment information, authorization message, authentication message, or unique identifier to be used to verify the user of a wireless device. In this embodiment, one advantage is to be able to verify a user of a wireless device quickly while minimizing the amount of interaction required between the wireless device 20 and the localized terminal 80.

In one embodiment the wireless device 20 is associated with a software application that is selectable through the interface of the wireless device and wherein the wireless device 20 comprises a multi-axis motion sensor. In one embodiment the multi-axis motion sensor comprises a three axis or six-axis motion sensor. In one such embodiment, the software application is registered to operate with a mobile payment system 70 that is connected to a payment server 90 through either an internet connection or through a localized terminal 80. In this embodiment, the software application is configured to send payment information to a mobile payment system 70, to a localized terminal 80 or payment sever 90 upon request by the user. In another embodiment, the software application employs the user's payment information or adaptive profile to provide secure authentication information to a localized terminal 80, payment server 90, or mobile payment system 70. In one embodiment, a software application is configured to receive and format location-based information associated with a general proximity near the wireless device 20 provided by a multi-axis motion sensor. In this embodiment, some location-based information could be items within a store. The motion sensor is then used to detect the direction of the wireless device and provide the location or information related to items based upon the directional movement of the wireless device 20. In another embodiment, the motion sensor is able to provide near real time location-based information to a management component 30 residing on the wireless device 20. The data management component taking the location-based information received from the motion sensor as a parameter is then configured to present information regarding an item or location based upon the directional movement of the wireless device 20. A data management component 30 can also be used to update an adaptive profile associated with a wireless device 20 based upon data received from a motion sensor located on the wireless device. In another embodiment, the wireless device 20 receives location-based information from a motion sensor and uses at least some of the information received from the motion sensor to initiate, validate, or authenticate a mobile payment using a mobile payment system 70 that may comprise a localized terminal.

In another embodiment, the user through a software application can purchase an item associated with a given location through interactions with a localized terminal 80 that is either in communication with a payment server 90 or mobile payment system 70. Wherein the software application is configured to display payment information at least comprising account information, reward card information, or payment confirmation information to the user of the wireless device upon receiving such information from a localized terminal 80 or payment server 90. A software application in communication with a mobile payment system can also use various authentication methods or encryption techniques to interact with a mobile payment system 70 for making purchases through a mobile payment system 70 in certain embodiments.

In another embodiment, the wireless device 20 is associated with a software application that is operatively connected to a mobile payment system 70 and a location-based service 10 wherein the software application is configured to provide an item identification number, amount of item, or adaptive profile information associated with the user to a mobile payment system 70. In one embodiment, the software application is also configured to receive location-based information from the location-based service 10. In one such embodiment the wireless device 20 comprises either a NFC-enabled computer chip. NEC component, or secure memory used for making mobile contactless payments through the mobile payment system 70. In this embodiment the software application is configured to send an authentication message to a mobile payment system 70, receive an authentication message from the mobile payment system 70, send a payment message to a mobile payment system 70, and receive a confirmation request from the mobile payment system 70. In one such embodiment, the software application is configured to display the confirmation message comprising a confirmation request to a user that is selectable by the user to confirm purchase of an item via the mobile payment system 70, which once the user confirms the purchase by selection, the software application sends a confirmation for purchase to the mobile payment system 70. In one embodiment, a wireless device is configured to register with a location-based service 10, receive location-based information from the location-based service wherein the location-based information comprises at least information related to a physical item for sale within the general vicinity to the wireless device 20, sending payment information to a mobile payment system 70 that comprises at least some location-based information received from the location-based service and which relates to the physical item in the general vicinity of the wireless device, entering into secure communication with the mobile payment system 70, receiving an authorization message from the mobile payment system, receiving a confirmation message from a mobile payment system, confirming the purchase of the physical item within the near vicinity of the wireless device 20 which in turn send the confirmation message to the mobile payment system 70, ending the secure connection to the mobile payment system.

In another embodiment, the wireless device 20 registers with a mobile payment system 70, initiates a secure connection to a localized terminal 80 within general near vicinity of the wireless device, sends payment information associated with an adaptive profile of a user that comprises personal payment information to the localized terminal 80, sends an authentication message to the localized terminal 80 or payment server 90 (not located within the general vicinity of the wireless device), receives an authentication confirmation from the localized terminal, sending a payment message to the localized terminal 80, receiving a confirmation message confirming purchase an item from the localized terminal 70 or payment server 90. In one embodiment, the user of a wireless device is in a store and decides to purchase an item via a mobile payment. In this embodiment, the user can initiate a secure connection with a localized terminal moving his or her wireless device within a certain proximity of a localized terminal 80. Upon this user action either the wireless device 20 sends a message to initiate a secure connection or the localized terminal 80 upon recognizing the wireless device 20 sends a message to create a secure connection with the wireless device 20. The wireless device then sends payment information associated with an adaptive profile as well as an authentication message to either the localized terminal 70 or payment server 90 to authenticate a user, account, or adaptive profile. The wireless device then receives an authentication from the localized terminal 80 or payment server 90. After authentication has occurred, the wireless device can then send a payment request to the localized terminal for purchase of a good or service. The localized terminal 70 will in turn send a payment confirmation to the user confirmation the purchase. In another embodiment, the user can initiate a secure connection by using an application on the phone to create a secure connection with a localized terminal 80 or payment server 90.

In another embodiment a wireless device 20 or software application on a wireless device 20 can transmit payment information or adaptive profile information that is at least partially decoy or false information that is intended to disguise or mask actual payment information. In another embodiment, the wireless device 20 comprises removable memory that is secure and comprises payment information associated with a user of the wireless device. The wireless device 20 in this embodiment is configured to securely communicate with a localized terminal 80 that is associated with a mobile payment system 70, and to make a purchase request that is sent to the localized terminal 80 and/or mobile payment system 70. In another embodiment, the wireless device 20 comprises a dual core processor or quad-core processor and an adaptive profile. In one embodiment the processor is used for NFC communication and/or purchases made through a NFC-based system. In one embodiment, the adaptive profile can comprise payment information, personal identification information (social security number, bank account, PIN number, date of birth, username, alias, password, etc.), medical history information and/or transaction information (previous purchases, locations of purchases, advertisements received from a mobile payment system 70 or location-based service 10, payment amounts, card types, investment account information, merchant identifier numbers) that can be selectively or automatically transmitted to various NFC enabled components including a localized terminal, location-based service, payment server, or any other NFC-enabled component.

In another embodiment, the mobile payment system 70 is able to receive certain profile and/or payment information from the user of a wireless device 20. In this embodiment, the information includes credit card number, debit card number, prepaid card number, merchant identification, location-based information, alias, username, PIN, authorization code, authentication code, demographic information, or adaptive profile information. In this embodiment, the mobile payment system 70 is configured to provide this information to a payment server 90, location-based service 10, or database that is configured to either store the information or provide the information to other computing devices. The mobile payment system 70 can also be used to perform payment or customer analytics based upon the information received from the customer or send the payment or customer information to other computing devices for payment or customer analytics. In one embodiment, payment or customer analytics can be analysis, processes, or other methods performed on data that is used determine customer preferences, customer trends, revenue trends, and other analytics that can help businesses or track user purchase trends. In another embodiment, a payment server 90 is used to perform a similar function of receiving payment or customer information from a mobile payment system 70, location-based service 10, or localized terminal 80 in order to perform payment or customer analytics. In another embodiment, a location-based service 10 is configured to receive payment or customer information from a mobile payment system 70, localized terminal 80, or payment server 90 to perform customer and/or payment analytics on the information. In another embodiment, the payment server decrypts the encrypted payment information, stores at least some payment information from the user, and location-based information associated with the store or business the user is making the purchase from.

In yet another embodiment, the wireless device 20 is associated with a first localized terminal within the near vicinity of the wireless device and the first localized terminal is operatively connected to a second localized terminal within the general vicinity of the first localized terminal. In this embodiment, the first localized terminal is configured to receive adaptive profile information or payment information from a user related to a purchase and provide at least a subset of that information to the second localized terminal, wherein the second localized terminal is configured to either store some adaptive profile or payment information or send such information to a location-based service 10, payment server 90, server, or database.

In another embodiment, the mobile payment system 70 at least partially resides on a wireless device 20 and is configured to display, either through a software application or graphical user interface, graphs or charts related to the spending habits, trends, and history of payments made through the mobile payment system 70, other application, or service. A graphical user interface or graphical map interface can be used to display such historical information such as a graphs, charts, or other listings to a user regarding spending habits, trends, and history made through the mobile payment system other application, or service. In another embodiment, a mobile payment system 70 displays graphical representations of user accounts such as credit cards, bank cards, debit cards, loyalty cards, recent transactions, statement periods, deposits, payment trends, and/or budget information to a user. In another embodiment, a software application generally associated with a wireless device displays graphical representations of user accounts such as credit cards, bank cards, debit cards, loyalty cards, recent transactions, statement periods, deposits, payment trends, and/or budget information to a user.

In another embodiment, the wireless device 20 is configured to provide (either through a display or software application) near real-time reporting information regarding purchases made at a given location to a payment server 90, location-based service 10, or other service that is configured to perform operations or store such information. In another embodiment, the wireless device 20 is configured to display, store, or transmit (either through a display or software application) receipt information that comprises the sales tax, amount of purchase, and other information typically associated with a paper receipt. In another embodiment, the mobile payment system 70 or localized terminal 80 is configured to provide a discount or coupon to a user at the time a purchase request or session is initiated or before such session is initiated without the interaction of the user. In another embodiment the mobile payment system is configured to receive an alias that is associated with an adaptive profile of a wireless device user and is identifying account information associated with the user.

In another embodiment, a wireless device is in communication with a mobile payment system 70 comprising a localized terminal 80 and payment server. In this embodiment, the wireless device is configured to retrieve adaptive profile information from the payment server 90 for use in making a mobile purchase. In this embodiment, once the adaptive profile information is retrieved from the payment server, the wireless device is operable to initiate a purchase request with the localized terminal 80. In this embodiment, the wireless device sends an authentication request to the localized terminal that is a location-based authentication request. In this embodiment, the wireless device can send an authentication request that comprises that is not location-based. Once the localized terminal authenticates the wireless device, the wireless device 20 is operable to send a payment request comprising at least some adaptive profile information to the localized terminal 80. The localized terminal processes the information or sends at least some information to a payment server 90 to confirm the payment request. In this embodiment, upon confirmation by the payment server 90 or localized terminal 80, the wireless device receives a confirmation from the localized terminal 80 and the user selects the confirmation via the interface of the wireless device 20 to confirm the mobile purchase. For example a wireless device, in one embodiment, can receive his or her payment information or an adaptive profile associated with payment information from a payment server to be used in making a mobile payment. One advantage of receiving this information is that the burden on the user is minimized. Once information is received from the payment server 90, the wireless device 20 can send a payment request comprising at least some adaptive profile information such as credit limit, account number, or secure identifier associated with the payment request to a localized terminal 80 that is within the general vicinity or connected to the wireless device. Upon receiving the payment request from the wireless device 20 the localized terminal 80 is configured to send at least some of the adaptive profile information associated with the payment request to a payment server 90 (perhaps for a questionable, unsecure, large payment, or other special event encountered by the localized terminal 80). The payment server 90 confirms, approves, or authorizes the payment request and send a message to the localized terminal 80, which in turn provides a payment confirmation message to the wireless device 20. This message is displayed to the user via the device's graphical interface and the user selects or confirms the purchase by selecting the confirmation icon, message, touch screen icon, or other on screen display representing a confirmation message. The purchase is now complete.

A communication between a wireless device 20 and localized terminal 80 can include the user of the wireless physically tapping the localized terminal to create a communication link. An authentication message received by the wireless device 20 received from a localized terminal 80 that is communicatively coupled to the wireless device 20 via a NFC-based connection can be displayed on the graphical user interface of the wireless device a NFC connection icon. It can be appreciated that a user of the wireless device 20 can decline the transaction either before or after receiving a payment confirmation message. In another embodiment, the wireless device can establish a Bluetooth connection with a localized terminal and the terminal can establish either a NFC-based or Bluetooth connection with a payment server 90 or mobile payment system 70. In another embodiment, the wireless device can send an registration request to a mobile payment system 70, an authentication request to a mobile payment system 70, and a purchase request to a mobile payment system 70 in order to complete a mobile payment that does not require use of a magnetic strip. A payment server 90 can communicate with other servers or databases such as an account server, coupon server, merchant loyalty server, or payment issuer server to authorize a transaction. A graphical user interface that can be associated with a mobile payment system 70 or software application associated with a mobile payment system can display credits cards associated with a user on a tab, table, or other display as well as display the same for reward cards. The graphical user interface can also be configured to display credit card and reward cards at one time to a user. A graphical user interface associated used for presenting payment information can use 3D graphics. A graphical user interface used for presenting payment information or adaptive profile information can be configured to dynamically update information associated payment information or adaptive profile and display the same to the user. In another embodiment, the user of a wireless device 20 can enter an amount to be paid, initiate communication with a NFC-based localized terminal, add gratuity, or confirm a purchase through a voice command. In another embodiment, the wireless device is configured to use encryption techniques to store payment information or adaptive profile information with a secure memory card or secure memory residing on the wireless device. In another embodiment, the wireless device 20 can use encryption techniques to encrypt data to be sent to a localized terminal, which can be the same as the encryption techniques used in storing information on a secure memory card or secure memory or different encryption techniques that those used for storing information on the wireless device. Adaptive profile information that is configured to be displayed to a user of the wireless device 20 can allow the user to enable or disable mobile payments, add voice identification security, set passwords, save passwords, modify display format, change currency, change fields which can be auto-filled, and modify other user preferences. A payment request can be sent from the wireless device via a web page, SMS message, a voice command, NFC-enabled message, web-based application or software application on the phone.

In another embodiment the wireless device can be configured to send a confirmation message to a localized terminal 80 or mobile payment system 70, that is configured to confirm or finalize the purchase without further interaction necessary with the localized terminal 80 and mobile payment system 70, even though further interaction. In another embodiment, the wireless device 20 can register with a payment server, and can register via an online message, registration message, authentication message, or other transmission that can include payment information or an adaptive profile associated with a user and used for making mobile payments. In some embodiments, the user of the wireless device can create an alias associated with a payment account or method. However, a mobile payment system 70 or payment server 90 can create an alias for a user based upon payment information received from the wireless device or other computing devices included a server or a database. A payment server 90 can enroll the user into an alias based upon payment information received from the user, with minimal or no interaction with the user. The localized terminal 80 can be in communication with a mobile payment system 70, payment server 90, other computing device wirelessly or through a wired connection. In one embodiment, the localized terminal once in communication with a mobile device that is requesting to pay via a mobile payment, can send authorization, authentication, or other messages to a mobile payment system to determine whether the wireless device can make a purchase with via a mobile payment or adaptive profile. In another embodiment, the localized terminal can send payment information associated with a user of a wireless device making a mobile payment to a payment server 90. In this embodiment, the payment server 90 is configured to receive at least some payment information that can be used by financial or other business to analyze a specific mobile payment, either in a larger data set or individually.

In another embodiment, the user of a computing device uses an application to perform the same function of searching based upon physical locations, such as an intersection or other physical locations. Thus in this embodiment, the user of a computing device initializes the application, provides the search terms via data entry or through voice commands such as an address or intersection of streets, initiates the search, and the application returns the results.

In another embodiment, the user of a computing device uses a location-based service 10 to perform the same function of searching based upon physical locations, such as an intersection or other physical locations. Thus in this embodiment, the user of a computing device provides the search terms via data entry or through voice commands such as an address or intersection of streets or a certain the location of the wireless device 20 to the location-based service 10, initiates the search, and the location-based service 10 returns the results.

In yet another embodiment, a user of a computer device can search a geofenced location, by entering specific information to search for within the geofenced location, and receiving such information on the computing device. In another embodiment, the geofenced area 60 can be searched by a wireless device 20, and the results of the search can be displayed on a graphical user interface to the user. This search capability can be associated with an internet site, application, network(s), database(s), server(s), location-based service 10, or a combination of any of these components.

In one embodiment, a wireless device 20 can also be configured to have an adaptive profile. In one embodiment the adaptive profile can used to update, store, manage, or select which information is shared with certain locations, when the information is shared, how much information is shared, how often the information is provided, sets the security of level for the user regarding any data provided to location-based-services, networks, determines whether the user can purchase items associated with a certain location, determines whether the user is qualified (of a certain age for example) to purchase products or visit the location, and also can update privacy settings on the wireless device 20.

In another embodiment, an adaptive profile provides profile information to a location-based service 10 or geofenced area 60 that includes age, gender, demographic information, interests, games, payment information, time-sensitive information, secure information over a secure connection (one non-limiting example Secure Socket Layer or the IPsec protocol) shopping preferences, transaction history, past locations visited, access to user account information using secure protocol or transmission, internet browsing history and/or preferences, other interests, etc., and combinations thereof.

In one embodiment, the adaptive profile is dynamic in that it can send or receive location information that will update the wireless device 20. In another embodiment, the adaptive profile manages security settings for the wireless device 20. In another embodiment, the adaptive profile is used to manage privacy settings for location-based services 10. For example, the adaptive profile can only provide certain information to a location-based service 10 based on the type of the location-based service 10 or type of location. Similarly, in another embodiment the adaptive profile can make the user anonymous in a particular location, location-based service 10 or geofenced area 60. In addition, the adaptive profile can monitor the location-based service 10 or geofenced area 60 for updates to location information associated with a particular location. The adaptive profile can be set by the user but can also be updated without user interaction. In another embodiment, the adaptive profile can be pre-programmed to perform certain functions such as storing certain location information, sending certain information to a location, location-based service 10 or geofenced area 60, receiving certain information, authorizing payments to a certain location, or managing data. In addition and in another embodiment, an adaptive profile can also be used as a sort of identity profile for the user when using location-based services 10. For example in this embodiment, the user can establish a profile that can include personal information, interests, dislikes, preferred location-based services 10, locations, location-based games, payment information, or any other information associated with a user. Still further, in this embodiment the wireless device 20 can transmit or use the profile in association with a location, location-based service 10 or geofenced area 60. This embodiment, allows the user control over which information to share or use with a location, location-based-services or geofenced location. In another embodiment the user can set up the profile and then the wireless device 20 can automatically provide the profile to location-based services 10, networks, or geofenced locations. In another embodiment the adaptive profile can update itself without user interaction in a sort of set it and forget it technique. In this embodiment the user benefits because he/she will not have to constantly manually update or opt-in to certain networks or services, but instead rely on the adaptive profile to automatically interface with the location-based service 10 and/or network.

In another embodiment the adaptive profile is the user's location-based identity and the adaptive profile can perform such functions as purchasing items, receiving advertisements based upon the user's profile, share the profile with other users of a location-based service 10, etc.

In another embodiment, the adaptive profile can deploy one more of the following privacy-enhancing technologies such as on/off switches, techniques related to anonymity, techniques related to k-anonymity, data security techniques, blocking techniques that prevent certain networks, people, or locations from receiving any information about the user, filtering techniques that protect a wireless device 20 user, and any other technology that enhances the user's location-based experience.

In one embodiment the wireless device 20 further comprises a data interface capability. The data interface capability can be any type of message protocol that allows location information to be received by a wireless device 20, computing device, location-based service 10, and/or geofenced location. Similarly, the data interface capability can also be configured to receive information on behalf of a wireless device 20, computing device, location-based service 10 and/or geofenced location. The data interface capability can be able to operate with IEEE 802.x, 802.11, et seq., 802.16, et seq., IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, CDMA, self organized network methodologies, SU-MIMO, MIMO, frequency domain equalization schemes, and any other communication protocol that supports location-based services 10 or location-based information. In another embodiment, the data interface capability can provide location information to user in response to a voice command from the user.

The wireless device 20 can have the capability to display location information on a 3D display as well as the capability to serve as a router of location-based information with other wireless devices in a network, location, location-based service 10, and/or geofenced location. The wireless can have a dual processor, multicore-processor, and/or a dual processor architecture. The wireless device 20 can be capable of displaying information dynamically. The wireless device 20 can be a vehicle or bus. The wireless device 20 can be configured to operate with IEEE 802.11, 802.16, IPv4, IPv6, Internet Protocol only communications channels, IPsec, Secure Sockets Layer, Transport Layer Security, Secure Shell, OFDM, OFDMA in an uplink or downlink, SC-FDMA, hybrid OFDMA and SC-FDMA, self organized network methodologies, SU-MIMO, MIMO, frequency domain equalization schemes, and any other communication protocol that supports location-based services 10 or location information. In one embodiment, the wireless device 20 further comprises an accelerometer and/or motion sensor that can be used to ascertain the location of the wireless device 20 (either dynamically or manually).

Figure 30:
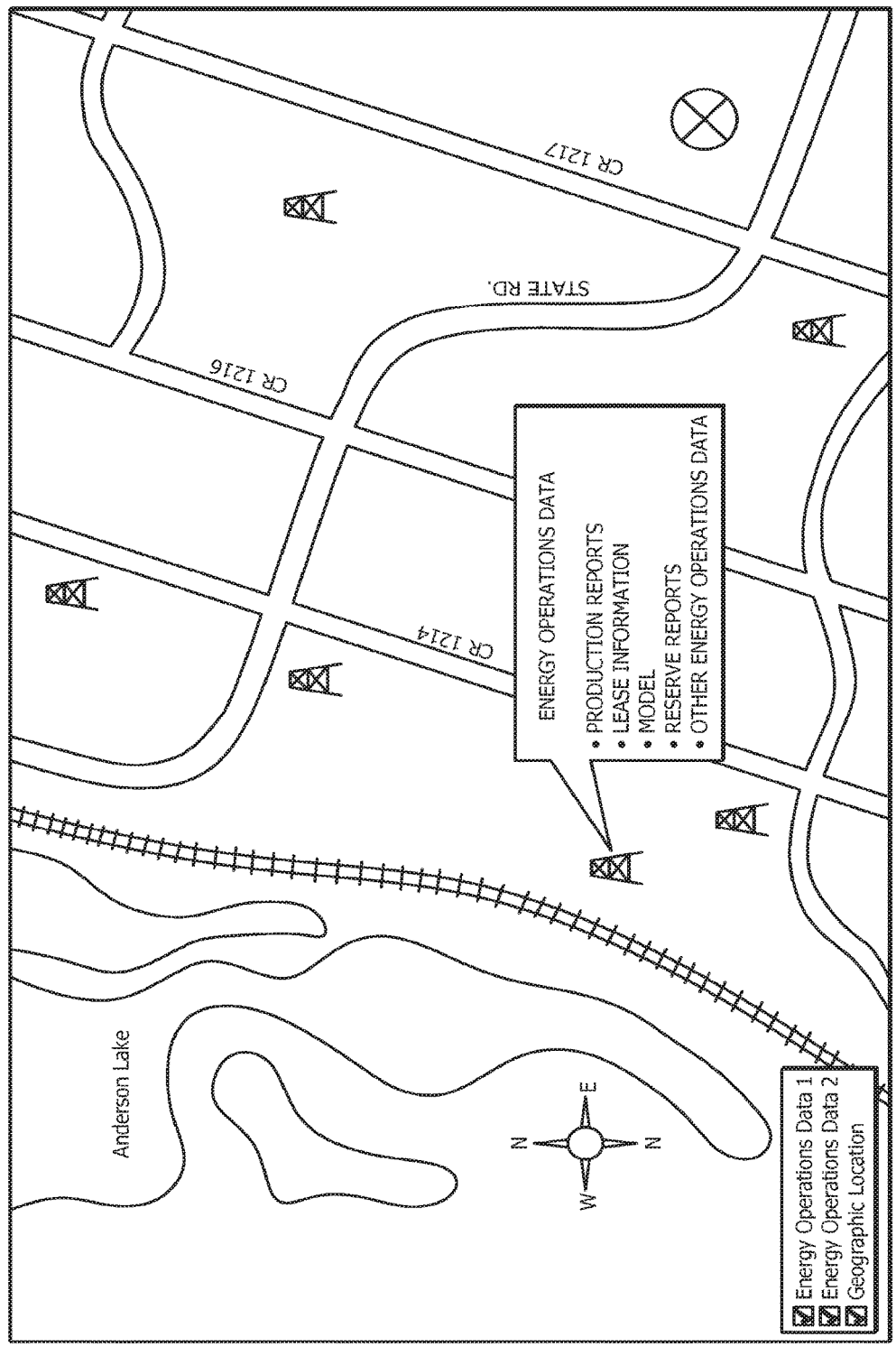
FIG. 30 depicts a graphical map interface in one embodiment.

Now referring to FIG. 30, FIG. 30 depicts a graphical map interface in one embodiment. As depicted, the background is a graphical map interface and the scope of the map is a geographical location or other designated area. The oil derricks represent oil or gas wells that can be active, non-active, orphan, or potential oil and gas wells. The circle represents a water or disposal station. The railroad tracks represent oil or gas pipelines. The callout shows how the map interface, in one embodiment, is configured to display energy operations data related to an object on the map. A user may select an object on the map interface. The selection can be made via any method including touchscreen, hovering over the object, panning the displaying, zooming in, zooming out, clicking the object, or clicking a link to the object. The energy operations data may also be linked to where the energy operations data can be expanded in a pop-up box, other screen, or somewhere else on the page if the link is selected by the user. Alternatively, the energy operations data can be displayed in a pop up box on the screen or be shown on an additional screen. In another embodiment, energy operations data can be stored on memory associated with either the computing device or location-based service.

Figure 31:
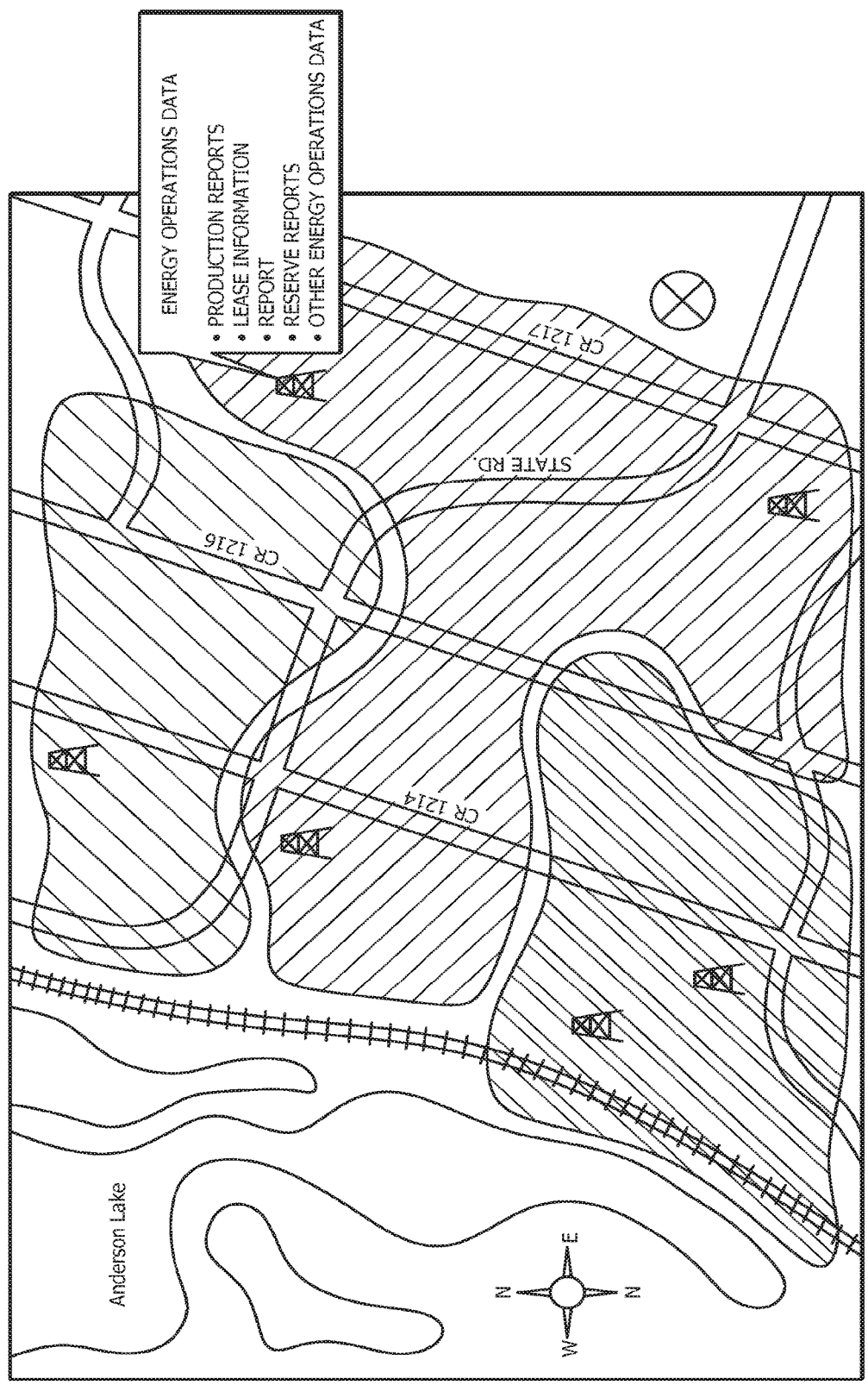
FIG. 31 depicts a graphical map interface in one embodiment.

Now referring to FIG. 31, this figure depicts another graphical map interface in another embodiment. The background is a graphical map interface, similar to that shown in FIG. 30. The map interface shows the geographical location. In the embodiment depicted, the shaded areas represent a heat map related to energy operations data associated with the geographical location. For example, the different shades represent different heat maps. This is for illustrative purposes only as other energy operations data such as well depth, production, etc. can also be shown on the graphical map interface. The map can include objects or icons for energy operations data such as oil or gas locations, pipelines, and other energy operations data. As depicted, this is a map display that can show hot or cold (heat map) areas on the display that show activity such as oil or gas production, permits, pre-permits or other energy operations data. The heat map regions are also selectable by user and upon selection can provide energy operations data to the user via a pop up box, display on different screen, or upon a hover can display additional information associated with the heat map region.

Figure 32:
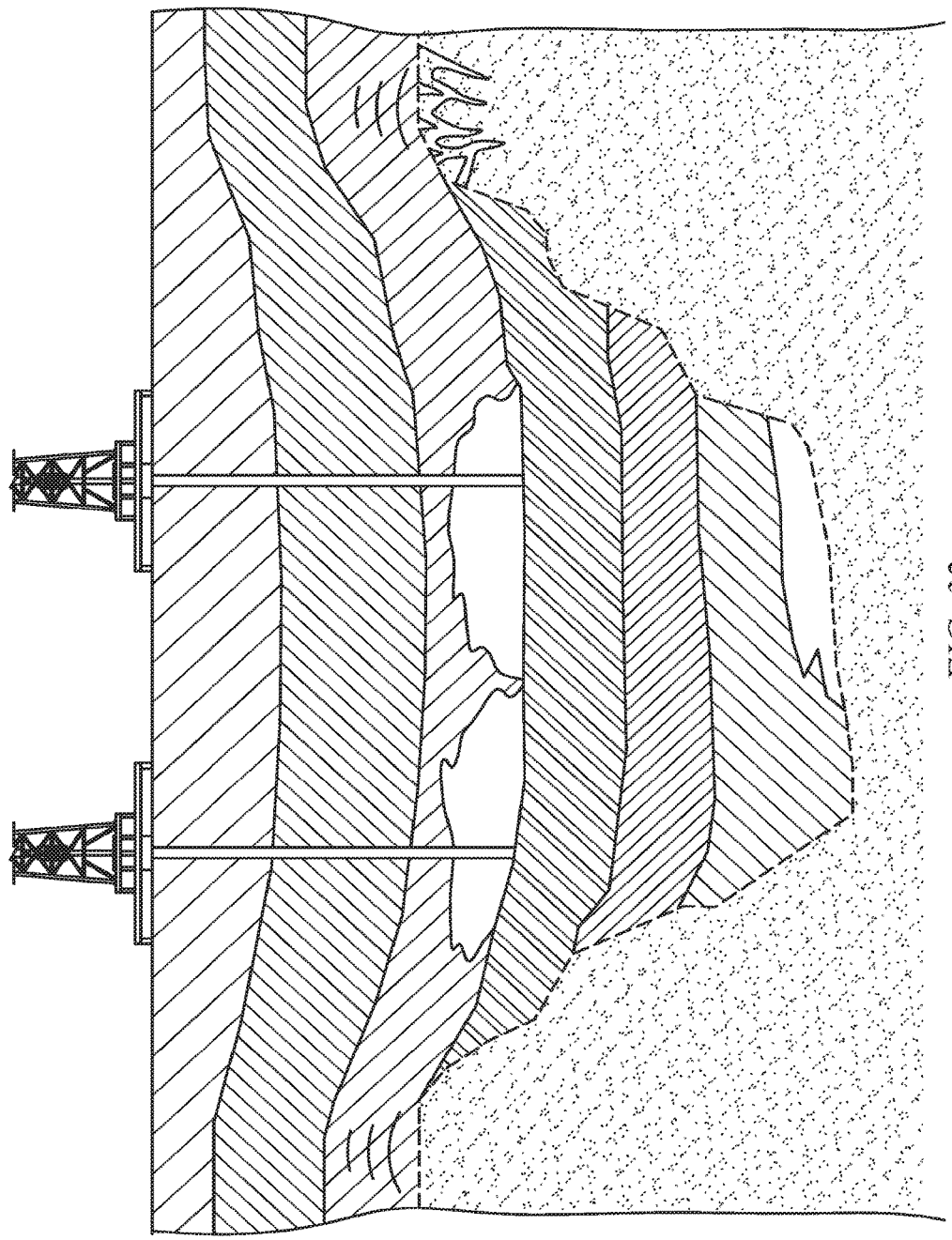
FIG. 32 depicts a graphical map interface in one embodiment.

Referring now to FIG. 32. FIG. 32 is a different graphical map interface in one embodiment. The curvy line represents a two-dimensional or three-dimensional geographic representation of subterranean, seismic, adaptive drilling profile information, or energy operations data. The change in pattern can illustrate changes in energy operations data, in rock formations, etc. As depicted, the figure comprises two oil or gas wells. The graphical map interface can display the drilling angle, drill depth, or any other energy operations data. The mapping interface can also be converted to a report for analysis of production or economic decision analysis. A system of this type can also track drilling operations, head count on the well, accounting, costs associated with the drilling, production, revenue associated with drilling, trends (both financial and production), or any other oil filed metric that can be used for economic or production decision analysis. For example, the large amount of information associated with a drilling, pipeline, or potential drilling location is significant. One potential advantage of this embodiment is that it can reduce the time it takes to present the information to the user or process the data in a more efficient manner based upon the user's needs. In one embodiment, a mapping interface is provided that has a graphical user interface overlay. In this embodiment, the graphical user interface overlay comprises icons or other graphics that display energy operations data comprising either subterranean energy operations data or surface energy operations data.

While the energy operations data in this embodiment can be any type of energy operations data, energy operations data can be production data associated with a drilling operation that includes estimations on production, trend analysis, or graphics that represent a graphical model of the production of a drilling operation. A drilling operation as used in this embodiment can be one or more oil wells, gas wells, or pipelines. In another embodiment, an adaptive drilling profile is created by a data management component 30 that is either partially stored in memory on a computing device or on memory at least partially stored on a server and is used to create a model of energy operations data associated with the drilling operation. The adaptive drilling profile is adaptive in that it can modify or adjust based upon user interactions with the adaptive profile or upon changes to the drilling operation or locations the adaptive drilling profile is associated with. In another embodiment, an adaptive drilling profile is a kind of adaptive profile that can be used for financial decision analysis, pipeline analysis, energy operations data, production decision analysis techniques, invoicing, and costs associated with a drilling operation. In another embodiment, the adaptive drilling profile can incorporate energy operations data associated with the drilling operation that is needed by the user with minimal user interaction.

The adaptive drilling profile can also include costs and expenses associated with the drilling operation and is used for analyzing production versus the economic factors associated with the drilling operation. In another embodiment, an additional adaptive profile is associated with the drilling operation or prospective drilling operation and is used for predictive cost and economic analysis based upon economic factors associated with the operation. In one embodiment, the graphical user interface overlay can also display a geofence that is used to create a custom drilling operation that comprises one or more wells or pipelines. In this embodiment, the geofence is either the well itself or a grouping of wells. The user can create custom models from the adaptive drilling profile for making economic or production analysis. In one embodiment, the data management component can receive energy operations data from multiple servers or databases and upon receipt of this data can graphically represent this information on the mapping interface. In one alternative embodiment, the data management component is configured to create a virtual interface that is configured to be displayed to the user or is configured to provide a remote virtual interface to the user. In another embodiment, the data management component upon receiving energy operations data can schedule tasks to be completed for processing the data using serial or parallel processing. In this embodiment, the data management component is configured to improve energy operations data or adaptive drilling profiles presentation to the user wherein the presentation can be made via a graphical user interface, interactive mapping display, static text-based display or any combination of display techniques. In another embodiment, energy operations data comprises horizontal or directional drilling data. In another embodiment, the computing device or location-based service can store energy operations data or at least one adaptive drilling profile off-line, wherein the adaptive drilling profile is accessible without a connection to the internet.

Various reports can also be created by a data management component based upon the needs of the user. Some example reports that can by dynamically created based upon the specific needs of the user are production reports, economic reports, invoices, manpower projections or costs associated with manpower, prospects, completion reports, and unconventional play reports that are either graphical in nature or text-based. In another embodiment, an economics analyzer is embedded or displayed on the graphical map interface for the user to access when looking at a mapping of energy operations data. In this embodiment, the economics analyzer can analyze decline curves, production rates, or other economic data associated with a drilling operation to display to the user. The economics analyzer can also recalculate an economic analysis based upon changed or modified energy operations data that is adjusted by the user. In another embodiment, the data management component is configured to create one or more adaptive drilling profiles comprising at least some energy operations data that are associated with a given location. The adaptive drilling profile or profiles can be modified by multiple users registered with a location-based service 10 or data management component 30 and where the adaptive drilling profile or profiles are updated through use of the data management component to provide users of the adaptive drilling profile or profiles a more enhanced yet efficient interface experience. In this embodiment, the data management component can be in operative communication with a data interface capability whereby it can receive updated energy operations data and/or location-based information that can be provided on a periodic or near real-time bases. In this embodiment, the data management component can be in operative communication with a plurality of data interface capabilities that comprise an interface for receiving either sensor data, mapping data, adaptive drilling profile, location-based data, energy operations data, or accounting data. In another embodiment, the data management component resides on a server and has operable access to at least one server. The data management component is configured to schedule tasks to be performed or completed by the database based upon an adaptive drilling profile associated with a given location and/or the user's request for additional information that is associated with the adaptive drilling profile. The data management component can be configured to create a customized profile based upon the request from a user. The customized profile can then be used to update the adaptive drilling profile.

In another embodiment, the data management component is configured to modify the graphical user interface and is in operative communication with a location-based service. In this embodiment, the graphical user interface is substantially interactive and is capable of displaying graphical information associated with an adaptive drilling profile (single or multi-user). Further in this embodiment, the data management component is a powerful and highly technical tool that is used to collect data from at least one location-based service, associate the data with an adaptive drilling profile relating to a drilling location or potential drilling location, and modify the data to be displayed on the substantially interactive graphical user display to accomplish predictive analysis related to economic or production decisions. Predictive analysis is a process whereby factors are analyzed to predict a result. In one embodiment, the predictive analysis uses data related to energy operations to predict economic or production results. By allowing a user to modify certain attributes or parameters of the adaptive drilling profile the data management component 30 is configured to provide updated data and an updated display based upon the data in substantially real-time. In another embodiment, the data management component is configured to receive location-based information or energy operations data from a plurality of data sources and integrate the information or data into a substantially customized adaptive drilling profile that is accessible by multiple users that are registered with a location-based service and/or data management component. In this embodiment, it can be appreciated that each user may have a profile associated with him or her that relates to the level of access and rights each user has with respect to the adaptive drilling profile created by the data management component. The data management component can also send data through a data interface capability that is a subset of data from an adaptive profile, which can be displayed to the user through a virtual interface via a graphical map interface. In another embodiment, the data management component can store and manipulate data received from different sources that will be included in an adaptive drilling profile for a given location based upon pre-determined settings of the system or pre-determined user settings whereas at least some of the adaptive drilling profile can be displayed via a virtual interface.

In one embodiment, a virtual interface is a cloud-based solution that allows for offsite data storage or potentially data display. In another embodiment, a location-based service having access to a plurality of databases through a plurality of data interface capabilities is configured to received energy operations data and create an adaptive drilling profile for a given location that is associated with at least some of the energy operations data received from a plurality of database. In this embodiment, the location-based service 10 is also configured to receive mapping data from a database in addition to receiving energy operations data from a plurality of databases. In another embodiment a data management component 30 resides on a server that is associated with a location-based service 10 and is configured to receive energy operations data from a plurality of data sources. In this embodiment, the data management component 30 is configured to modify an adaptive drilling profile based upon at least some energy operations data received from a plurality of data sources. In this embodiment, the data management component 30 is also configured to receive a request to filter the energy operations data provided to a computing device or wireless device by a data management component 30 and in turn, provide a filtered adaptive profile associated with request from the computing device or wireless device 20. In another embodiment, a location-based service 10 is configured to request and receive energy operations data from a plurality of data sources through one or more data interface capabilities. The location-based service is then configured to create an adaptive profile associated with a given location that comprises at least some energy operations data received from the plurality of data sources. In turn, the location-based service is then configured to provide at least part of the adaptive profile to a computing device. In this embodiment, the location-based service 10 is configured to provided updated energy operations data to the computing device wherein some of the updated data relates to the profile created by the location-based service or data management component.

In another embodiment, a location-based service 10 is configured to register a computing device with the service and receive a request for an adaptive drilling profile related to a given location. Wherein the location-based service 10 is configured to receive energy operations data from a plurality of data sources such as a database, mapping server, server, or other data source and is able to associate the data received from the plurality of data sources with an adaptive drilling profile that can be accessible by multiple registered users of mobile computing devices. In another embodiment, the data management component is configured to create an adaptive drilling profile based upon historical and recent energy operations data. In another embodiment, the adaptive drilling profile can include water analysis associated with a given location. In another embodiment, the adaptive drilling profile associated with a certain location can be viewed in various profile formats that a user or system may define for ease of use and increased analysis of a particular drilling operation. In another embodiment, a location-based service comprising a server and a database is configured to store adaptive drilling profiles associated with given locations wherein the adaptive drilling profiles associated with a given location comprise at least some energy operations data. In this embodiment, the server is configured to receive requests from a computing device and determine which information is needed from the database that is in operative communication with the server associated with the location-based service 10. Wherein the database is configured to modify an adaptive drilling profile based upon updated energy operations data received by the database from the server or servers. The database is configured to return a responsive adaptive drilling profile to the server and the server is configured to provide the adaptive drilling profile information to the user. The server can also format the adaptive drilling profile for presentation in a three-dimensional display if necessary. In addition, the location-based service can reside at least partially on the computing device or wireless device and display an adaptive drilling profile in a various formats including three dimensional display or via a report customized for a particular user.

In one embodiment, the graphical map interface is capable is displaying maps and/or icons in at least 1350 by 1000 resolution. In addition, a location-based service is able to modify an adaptive drilling profile based upon the movement of the graphical map interface by the user, wherein the adaptive drilling profile is modified by receiving updated energy operations data associated with the new focus of the graphical map interface. In another embodiment, the user can tag an icon associated with at least a portion of an adaptive drilling profile to receive messages associated with the icon based upon changes to the profile related to the icon. In this embodiment, the user can select an icon that can relate to a specific oil or gas well and receive messages about this well when a predetermined condition is met that is associated with the profile of the oil or gas well. In another embodiment, the user is able to select and work with a specific adaptive drilling profile associated with a given location but upon the user's inputs a location-based system 10 or data management component 30 can retrieve and provide geographically related adaptive drilling profiles to the user that are related in some manner to the adaptive drilling profile displayed to the user based upon user interactions. In one embodiment, geographically related refers to an item or place which is adjacent to or in close proximity with another item or place. In another embodiment, the data management component resides on a database associated with a location-based service and is configured upon receiving a request from the location-based service to identify and provide a profile associated with a user to the location-based service that can identify display preferences, user preferences, energy operations data accessible by the user, the write permissions associated with a user, and past history relating to certain locations accessed by the user, or past adaptive drilling profiles used or modified by the user. In another embodiment, a location-based service 10 that is configured to store on memory associated with a database at least some portion of adaptive drilling profiles associated with a geographical area. In this embodiment, the location-based service 10 is configured to receive a request from a server related to at least some information related to an adaptive drilling profile. The database in turn is configured to provide responsive data to the location-based service 10, which in turn provides the responsive data to the server in one more multiple transmissions. In this embodiment, the location-based service can be configure to format the responsive data to more efficiently provide the data to the requesting server. In this embodiment, the location-based service 10 can receive updated data from the server that can be stored on the database and associated at least partially with an adaptive drilling profile. In another embodiment, an adaptive drilling profile can be associated with a workflow comprising at least some energy operations data. Energy operations data may also be associated with a workflow relating to oil and gas operations. In one embodiment, a location-based service can create adaptive drilling profiles, modify adaptive drilling profiles, format, adaptive drilling profiles, or only provide energy operations data to a user depending on the user's adaptive drilling profile. In another embodiment, a data management component can create a model by grouping energy operations data. In another embodiment, a data management component can create a model based upon location-based information requested by a user. In another embodiment, the data management component creates an adaptive profile based upon the user's access level. In another embodiment, the data management component, creates a model when it displays energy operations data to a user on either graphical user interface, graphical map display, or graphical user overlay. In another embodiment, a data management component creates a model when it associates data with a given location, drilling company, or pipeline. In another embodiment, a data management component can create a model based upon pipeline, wind energy, or solar or other energy operations data that is associated with a given company, location, or energy type. In another embodiment, the data management is configured to create a profile based the information received from location-based service, which is received based upon a user profile.

In another embodiment, a geofence can be created by the user or data management component 30 whereby the geofence is associated with a specific geographic area. In this embodiment, a computing device is configured to receive either location-based information or energy operations data associated with the geofenced area through a data interface capability and is operable to display the location-based information or energy operations data via a graphical map interface. The graphical map interface can also display mapping data whereby the location-based information or energy operations data is display in a substantially overlay fashion on the mapping interface and can be represented by icons. In this embodiment, the graphical map interface can be dynamic to the extent the user can change views or the scope of the information displayed in the map interface. In another embodiment, an adaptive drilling profile can comprise a set of energy operations data associated with multiple geographic locations that are in near proximity or adjacent to one another. In another embodiment, a graphical map display or graphical user interface can display the frequency of event which can be represented as heat map shown with different colors, a bar graph, text, or report that can display the frequency of the event. For example, in one embodiment, a graphical map display or graphical user interface can display in red for example, the number of drilling rigs on a map and in another color, for example, green can show an area that has a lower number of drilling rigs. In another embodiment, an indication of a frequency of an event can be shown on a display by use of a graph or report. The indication of a frequency of an event relates to the number of times an event has occurred and/or an indication of how frequently the event has occurred. In another embodiment, a computing device can modify its display in near real-time by updating the display based upon real-time events such as user inputs, receiving updated energy operations data or location-based data, or changing a model based upon changed circumstances immediately after one of these events occurs. In this embodiment, it can be appreciated that near-real time reflects the knowledge that a display will take time to update when an input or aspect of the model or interface is changed and thus while it is not in real-time, the display or model can modified in near-real time. In another embodiment, a computing device, location-based service, server or database is configured to build an adaptive drilling profile that comprises at least some energy operations data. In one non-limiting embodiment, building an adaptive drilling profile involves collecting a plurality of energy operations data. In another embodiment, building an adaptive drilling profile involves displaying energy operations data received through a data interface capability where the user can view the energy operations data. In another embodiment, building an adaptive drilling profile that comprises at least some energy operations data means receiving energy operations data relating to one company's drilling operations. In another embodiment, building an adaptive drilling profile that comprises at least some energy operations data associated with a location consists of collecting the energy operations data and preparing a model to display on a graphical user interface, graphical map interface, graphical map overlay interface, or any combination of displays. In another embodiment, building an adaptive drilling profile that comprises at least some energy oprations data associated with a location entails collecting data that is specific to one location wherein the adaptive profile comprises data items associated with the localized profile that is the adaptive drilling profile. In another embodiment, building an adaptive drilling profile that comprises at least some energy operations comprises associating a general location to energy operations data received. In another embodiment, building an adaptive drilling profile that comprises at least some energy operations data associated with a location comprises associating the energy operations data received into a geofenced area which is then displayed to a user. In one embodiment, a geofence may be created by building an adaptive drilling profile. In another embodiment, a geofence can comprise a grouping of oil wells, gas wells, water stations, windmills, or pipelines where by energy operations data is associated with one or more of the oil wells, gas wells, water stations, windmills, or pipelines. In another embodiment, a geofence is associated with energy operations data relating to a drilling operation. In another embodiment a graphical user display or mapping interface is configured to associate energy operations into a geofence that comprises a user-selected grouping of one or more oil wells, gas wells, water stations, windmills, or pipelines. In one embodiment, a potential advantage of using a geofence to group energy operations data either by a computing device or location-based service is that the user or location-based service can display the data and update the data locally without having to go back and forth requesting data from a server or database. However, it can be appreciated that in another embodiment, the computing device or location-based service sends multiple requests for energy operations data to a server, database, or location-based service.

Figure 33:
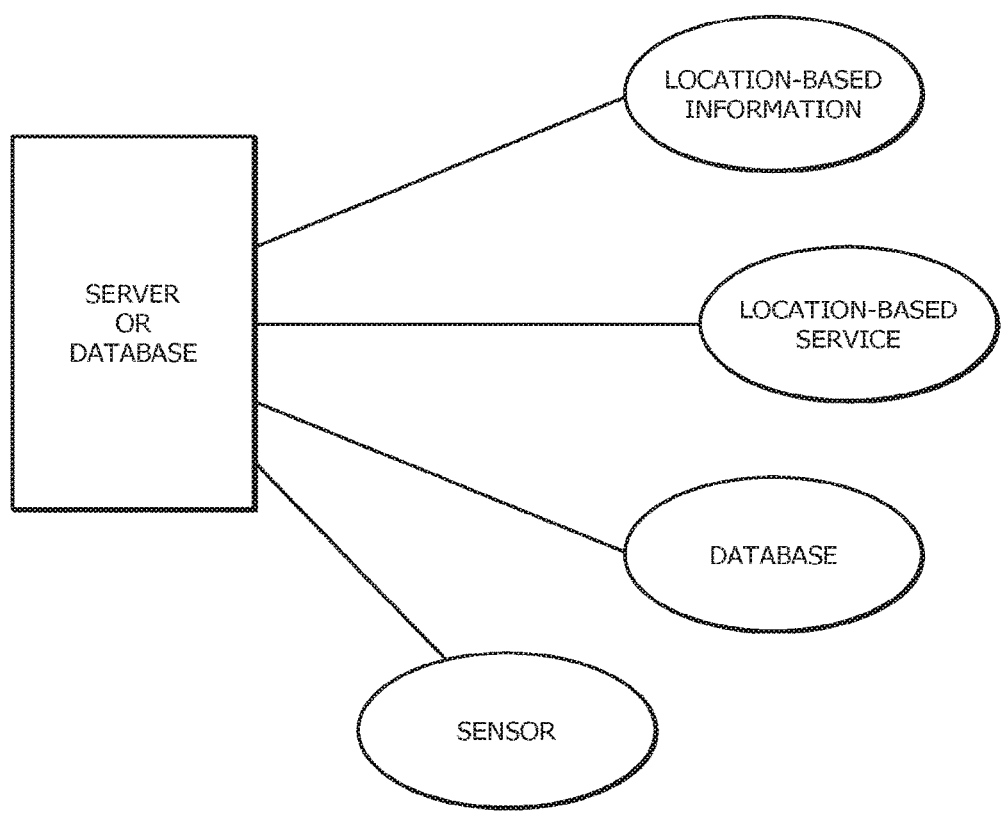
FIG. 33 depicts a server or database in one embodiment.

Referring now to FIG. 33, FIG. 33 depicts a server or database. This embodiment demonstrates the various sources a server or database may receive information from that is related to location-based information or energy operations data. The server or database (in the square) can receive location-based information, information from a database which can include location-based information, mapping data, or energy operations data, etc., energy operations data, or information from another server. The server or database can create a report or message that relates to the request or needs of a user. This report may also be dynamic or set on other predetermined criteria or constraints used by the server. The report may also be generated without a request from a user. In one embodiment, the general goal of the server or database is to efficiently create a report that is substantially dynamic in that it can change as the data from the various sources changes.

The terms "a" "an" or "the" as used herein are defined as one or more than one. The term "plurality" as used herein is defined as two or more than two.

While the invention has been particularly shown and described with reference to a preferred embodiment, it will be understood by those skilled in the art that various changes in form and detail can be made therein without departing from the spirit and scope of the invention.

We claim:

1. A system for managing location-based information associated with the oil and gas industry, said system comprising:
    a computing device operatively connected to a location-based service;
    wherein the computing device is operable to receive energy operations data from the location-based service, wherein said energy operations data comprises permit data for oil and gas wells related to a geographical location;
    wherein the permit data comprises permits for drilling of an oil or gas well;
    wherein the computing device is associated with a graphical map interface comprising mapping of the geographical location;
    wherein the graphical map interface is configured to display permit data for oil and gas wells through use of a heat map on the graphical map display;
    wherein the heat map is operable to display certain hot and cold areas related to the frequency of oil and gas permits within the geographical location;
    wherein the location-based service is configured to receive GPS data through a data interface capability from an oil or gas well associated with the GPS data; wherein the GPS data is configured to provide coordinates of an oil or gas wells; wherein the graphical map interface is configured to display an icon representing an oil or gas well on the heat map; and
    wherein the location-based service is configured to communicate with the computing device using an application programming interface.

2. The system of claim 1 wherein the graphical map interface is configured to display a plurality of geofences, wherein each geofence represents a well, and the geofence represents the amount of oil or gas production from the geofenced well.

3. The system of claim 1 wherein the location-based service is configured to provide mapping data, oil or gas production data, operator name, pipeline data, and an indication of a frequency of an event related to a geofenced drilling operation to a wireless device through a LTE-based data interface capability, and wherein the graphical map interface is configured to display the oil or gas production data, the operator name, the pipeline data, and the indication of the frequency of the event.

4. The system of claim 1 further comprising a data management component configured to model energy operations data to estimate through predictive analysis future oil and gas production of one or more oil wells.

5. The system of claim 1 further comprising a data management component associated with the location-based service and configured to receive a plurality of energy operations data from a plurality of sources and modeling an adaptive drilling profile to be displayed on the graphical map interface.

6. The system of claim 1 wherein the graphical map interface is configured to display an indication of horizontal and vertical wells and wherein the production of each vertical or horizontal well is displayed through a geofence sized based upon the oil and gas production.

7. The system of claim 1 further comprising a cloud based storage system for storing oil and gas data; wherein the system is collectively used within a cloud computer architecture.

8. The system of claim 1 wherein the location-based service is configured to send a wireless device comprising a smartphone with a touchscreen energy operations data associated with a geofence and in near proximity to the wireless device; and wherein the location-based service is configured to interface with a cloud based storage system.

9. The system of claim 1 wherein a geofence is displayed on the graphical map interface; wherein the geofence is associated with an oil or gas region; wherein a plurality of geofences are also displayed inside the geofence associated with the oil or gas region.

10. The system of claim 1 further comprising an economics analyzer configured to analyze historical decline curves for oil or gas wells within a geofenced area that is displayed on the graphical map display.

11. The system of claim 1, further comprising an economics analyzer configured to model production rates of oil or gas wells inside of a geofenced location pre-determined by the system and displayed on the graphical map interface.

12. The system of claim 1, further comprising an economics analyzer configured to model production rates of oil or gas wells inside of a geofenced oil and gas drilling area.

13. The system of claim 1, wherein the location-based service further comprises a data management component configured create multiple adaptive drilling profile comprising three-dimensional seismic data associated with a geofenced location.

14. The system of claim 1, wherein the location based service is configured to provide three-dimensional seismic data associated with one or more oil wells inside of a geofenced area.

15. The system of claim 1, further comprising a graphical user interface overlay that comprises multiple icons, and wherein the icons represent oil or gas wells.

16. The system of claim 1 wherein the location based service is configured to create a geofenced drilling operation and display at least a portion of the geofenced drilling operation on the graphical map interface; wherein the location-based service is configured to perform trend analysis associated on the drilling operation.

17. The system of claim 1 wherein the graphical map interface is configured create a geofence that is associated with one or more oil well; wherein the geofence is sized based upon the oil or gas production of the well and wherein the geofence is displayed on the graphical map interface; wherein the location-based service is configured to provide three-dimensional seismic data to the computer device for display on a graphical user interface.

18. The system of claim 1 wherein the location based service is configured to create multiple geofences inside a larger geographic area that are displayed on the graphical map interface and wherein multiple geofences are created for one or more oil wells, wherein the graphical map interface is configured to size the geofences by the amount of production of each oil well associated with each geofence; wherein the location-based service is configured to provide horizontal directional drilling data to the graphical map interface.

19. The system of claim 1 wherein the graphical map display is configured to display an icon representing one or more wells; wherein upon a click of the icon or hover a popup box is displayed; wherein the popup box comprises the operator name, lease name, initial completion date, depth of the oil well, and well type.

20. The system of claim 1, wherein the location based service comprises a cloud-based storage platform and is configured to store a plurality of a geofenced drilling operations; wherein each geofenced drilling operation comprises production data for oil or gas wells; predictive analysis models for future production, wherein the production of a well inside a geofenced drilling operation can be displayed through a geofence on the graphical map interface, which is sized based upon the amount of production of at least one or more oil and gas wells.

* * * * *